United States Patent
Oowada et al.

(10) Patent No.: US 8,885,420 B2
(45) Date of Patent: Nov. 11, 2014

(54) ERASE FOR NON-VOLATILE STORAGE

(71) Applicant: SanDisk Technologies Inc., Plano, TX (US)

(72) Inventors: Ken Oowada, Fujisawa (JP); Deepanshu Dutta, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 143 days.

(21) Appl. No.: 13/733,011

(22) Filed: Jan. 2, 2013

(65) Prior Publication Data
US 2014/0185382 A1 Jul. 3, 2014

(51) Int. Cl.
*G11C 11/34* (2006.01)
*G11C 16/34* (2006.01)
*G11C 16/14* (2006.01)
*G11C 16/04* (2006.01)
*G11C 11/56* (2006.01)

(52) U.S. Cl.
CPC ............ *G11C 16/14* (2013.01); *G11C 16/3418* (2013.01); *G11C 16/0483* (2013.01); *G11C 11/5635* (2013.01)
USPC ............ 365/185.29; 365/185.01; 365/185.03; 365/185.11; 365/185.17; 365/185.18; 365/185.19; 365/185.26

(58) Field of Classification Search
CPC .... G11C 16/0483; G11C 16/16; G11C 16/14; G11C 16/3472; G11C 2216/18; H01L 27/11524; H01L 27/11529
USPC ............ 365/185.01, 185.03, 185.11, 185.17, 365/185.18, 185.19, 185.26, 185.29
See application file for complete search history.

(56) References Cited

U.S. PATENT DOCUMENTS

| 7,313,029 | B2 | 12/2007 | Shen et al. | |
| 8,149,631 | B2 * | 4/2012 | Shiino et al. | ............. 365/185.29 |
| 2004/0113199 | A1 | 6/2004 | Hazama et al. | |
| 2006/0239077 | A1 | 10/2006 | Park et al. | |
| 2009/0046505 | A1 | 2/2009 | Lee et al. | |
| 2010/0074016 | A1 | 3/2010 | Higashitani | |
| 2012/0051136 | A1 | 3/2012 | Kang et al. | |
| 2013/0163338 | A1 * | 6/2013 | Kato | ........................ 365/185.17 |

OTHER PUBLICATIONS

International Search Report and Written Opinion of the International Searching Authority dated Mar. 27, 2014, PCT Patent Application No. PCT/US2013/077051, filed Dec. 20, 2013, 9 pages.

* cited by examiner

*Primary Examiner* — Fernando Hidalgo
(74) *Attorney, Agent, or Firm* — Vierra Magen Marcus LLP

(57) ABSTRACT

Techniques are disclosed herein for erasing non-volatile storage elements. A sequence of increasing erase voltages may be applied to a substrate. The select line may be floated and many of the word lines may be held at a low voltage (e.g., close to 0V). However, the voltage applied to an edge word may be increased in magnitude relative to a previous voltage applied to the edge word line for at least a portion of the sequence of erase voltages. The edge word line could be the word line that is immediately adjacent to the select line. The increasing voltage applied to the edge word line may prevent or reduce damage to oxides between the select line and edge word line. It may also help to regulate the e-field across a tunnel oxide of memory cells on the edge word line.

22 Claims, 16 Drawing Sheets

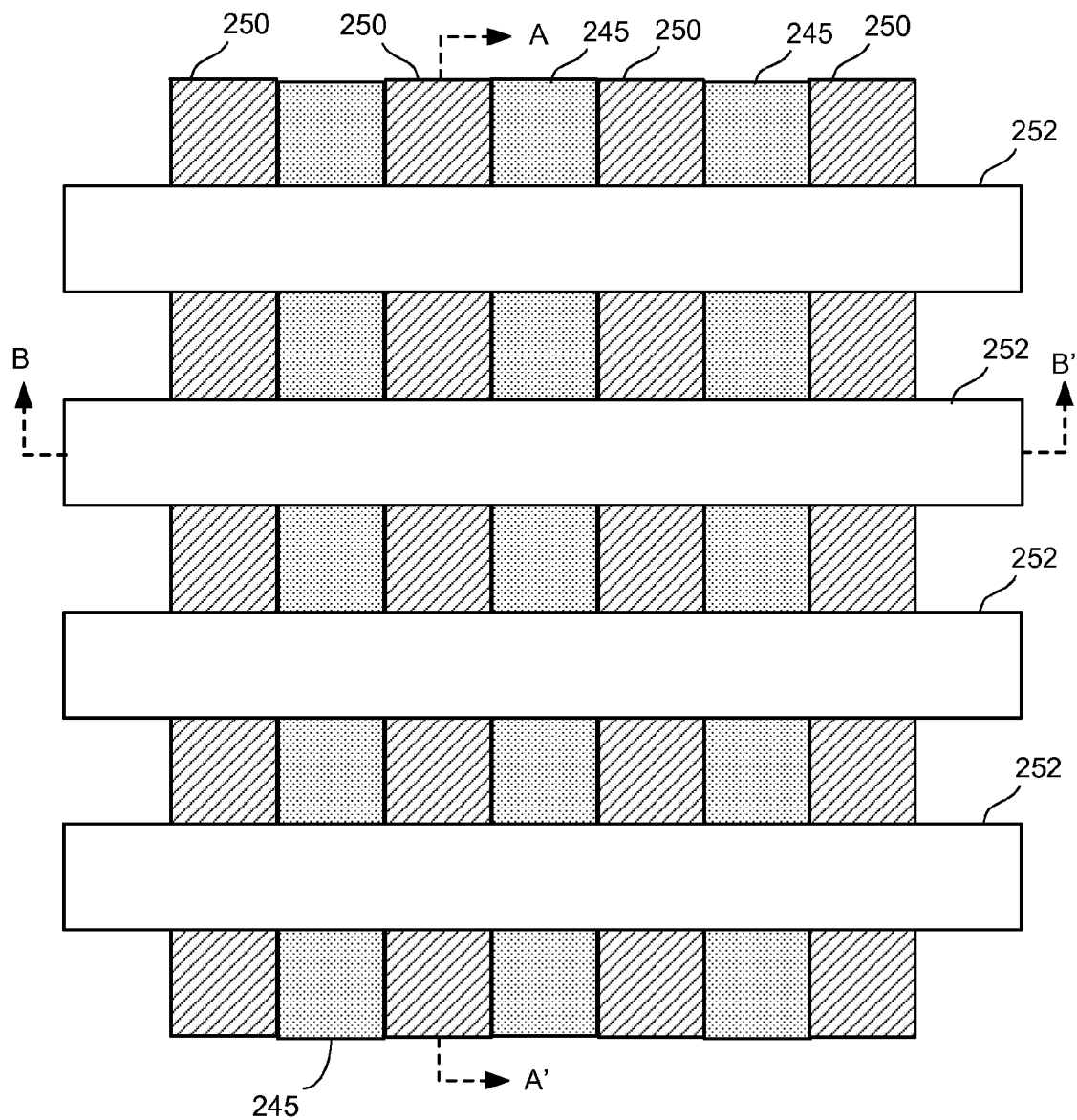

ERASE FOR NON-VOLATILE STORAGE

BACKGROUND

The present disclosure relates to technology for non-volatile storage. Techniques for erasing non-volatile storage are described.

Semiconductor memory has become more popular for use in various electronic devices. For example, non-volatile semiconductor memory is used in personal navigation devices, cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate and channel regions are positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

The memory cells in some EEPROMs or flash memory devices are arranged as strings. For example, some have a configuration referred to as a NAND configuration in which memory cells are grouped as NAND strings with each NAND string associated with a bit line. A NAND string includes numerous memory cells and a select gate at each end, in one implementation. A group of NAND strings may each be associated with a number of word lines that are used to apply control voltages to control gates of the memory cells. Also the group may be associated with select lines that are used to apply control voltages to the select gates.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state.

In some implementations, the memory cells are erased prior to programming. For some architectures, erasing can be performed on the entire memory array, on individual blocks, or another unit of cells. In one implementation, a group of memory cells is erased by raising p-wells of the memory cells to an erase voltage for a sufficient period of time. Word lines may be grounded when applying the erase voltage. An erase pulse moves the threshold voltage of the memory cells towards (or beyond) an erase target level, which may be below 0 Volts. In some implementations, after applying the erase pulse, an erase verify operation is performed to determine whether the threshold voltages of the memory cells have at least reached the erase target level. The erase pulse and erase verify are repeated with each loop using a higher amplitude erase pulse until the erase verify passes.

BRIEF DESCRIPTION OF THE DRAWINGS

FIG. 2B is a top view of the three NAND strings and word lines.

DETAILED DESCRIPTION

Techniques are disclosed herein for operating non-volatile storage. Embodiments disclosed herein erase non-volatile storage, such as NAND flash, while preventing or reducing damage to oxide.

In one embodiment, a memory device that includes a group of non-volatile storage elements that are associated with word lines and a select line is erased. The select line may provide a voltage for a gate of a select gate. The word lines may provide a control voltage for the storage elements. The storage elements could be memory cells on NAND strings. While erasing the storage elements a sequence of increasing erase voltages may be applied to a substrate. The select line may be floated and many of the word lines may be held at a low voltage (e.g., close to 0V). However, the voltage applied to an edge word may be increased in magnitude relative to a previous voltage applied to the edge word line for at least a portion of the sequence of erase voltages. The edge word line could be the word line that is immediately adjacent to the select line. The increasing voltage applied to the edge word line may prevent or reduce damage to an interlayer between the select line and edge word line, which may contain materials such as oxides or other dielectrics. It may also help to regulate the e-field across a tunnel oxide of memory cells on the edge word line.

The voltage applied to second and third edge word lines may also depend on the erase voltage. In this context, a second edge word line is the word line that is second closest to the select line and the third edge word line is the word line that is third closest to the select line. For example, the voltage applied to the second edge word line might increase or decrease as the magnitude of the erase voltages increases. Voltages applied to the second word line can help to regulate an electric field between the first edge word line and the second edge word line. Similar reasoning applies to the third edge word line. Further details are discussed below.

Example Memory System and Operation

Figure 1A:
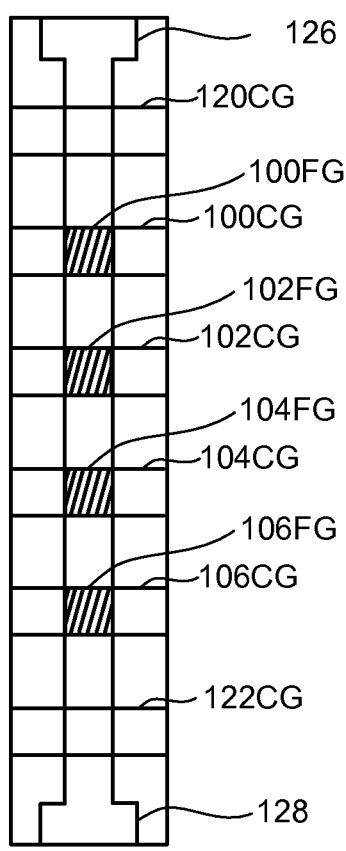
FIG. 1A is a top view of a NAND string.
Figure 1B:
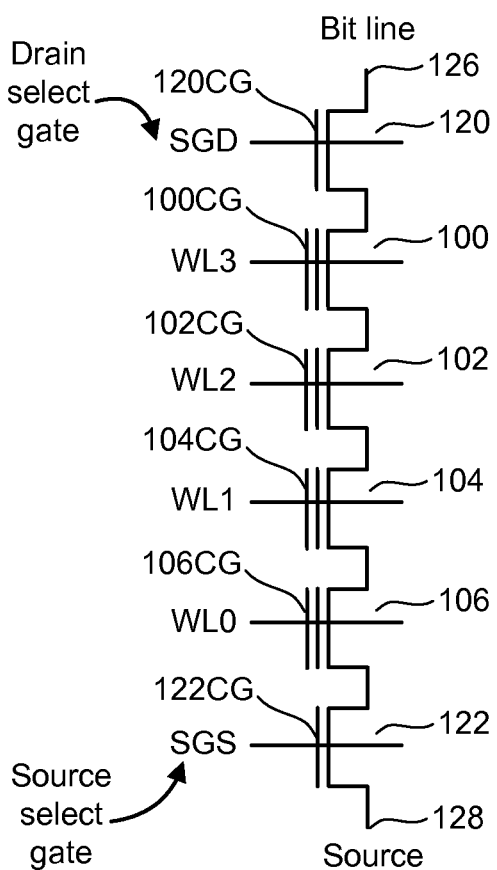
FIG. 1B is an equivalent circuit diagram of the NAND string of FIG. 1A.

One example of a memory system suitable for implementing embodiments uses a NAND flash memory architecture, which includes connecting multiple transistors in series between two select gates. The transistors connected in series and the select gates are referred to as a NAND string. FIG. 1A is a top view showing one NAND string. FIG. 1B is an equivalent circuit thereof. The NAND string includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, (where WL denotes "word line"), control gate 102CG is connected to WL2, control gate 104CG is connected to WL1, and control gate 106CG is connected to WL0. In one embodiment, transistors 100, 102, 104 and 106 are each storage elements, also referred to as memory cells. In other embodiments, the storage elements may include multiple transistors or may be different than depicted. Select gate 120 is connected to select line SGD. Select gate 122 is connected to select line SGS.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Figure 2A:
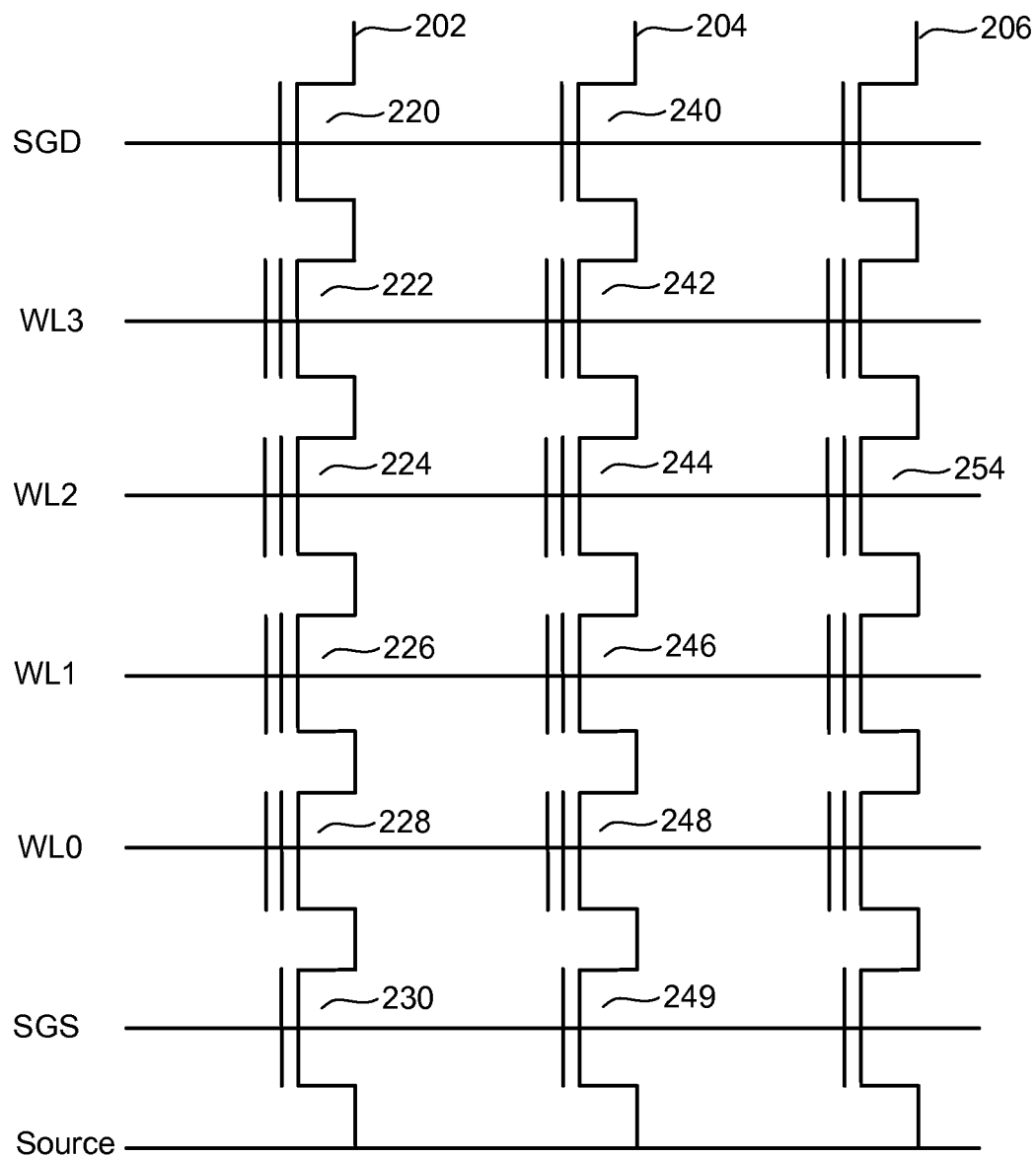
FIG. 2A is a circuit diagram of three NAND strings with associated word lines.

FIG. 2A shows three NAND strings 202, 204 and 206 of a memory array having many more NAND strings. Each of the NAND strings of FIG. 2A includes two select transistors and four memory cells. For example, NAND string 202 includes select transistors 220 and 230, and memory cells 222, 224, 226 and 228. NAND string 204 includes select transistors 240 and 249, and memory cells 242, 244, 246 and 248. Each NAND string is connected to the source line by its select transistor (e.g. select transistor 230 and select transistor 249). A selection line SGS is used to control the source side select gates. The various NAND strings are connected to respective bit lines by select transistors 220, 240, etc., which are controlled by select line SGD. In other embodiments, the select lines do not necessarily need to be in common. Word line WL3 is connected to the control gates for memory cell 222 and memory cell 242. Word line WL2 is connected to the control gates for memory cell 224, memory cell 244, and memory cell 254. Word line WL1 is connected to the control gates for memory cell 226 and memory cell 246. Word line WL0 is connected to the control gates for memory cell 228 and memory cell 248. As can be seen, each bit line and the respective NAND string comprises the columns of the array of memory cells. The word lines (WL3, WL2, WL1 and WL0) comprise the rows of the array.

FIG. 2B is a top view of a portion of an array of NAND flash memory cells. The array includes bit lines 250 and word lines 252. Shallow trench isolation (STI) structures 245 are depicted between the bit lines 250 (note the bit lines are not at the same level as the STI structures 245). Note that FIG. 2B does not show all of the other details of the flash memory cells. Note that a NAND string can have fewer or more memory cells than depicted in FIGS. 2A and 2B. For example, some NAND strings will include eight memory cells, 16 memory cells, 32 memory cells, 64 memory cells, 128 memory cells, etc. The discussion herein is not limited to any particular number of memory cells in a NAND string. Furthermore, a wordline can have more or fewer memory cells than depicted in FIGS. 2A and 2B. For example, a wordline can include thousand or tens of thousands of memory cells. The discussion herein is not limited to any particular number of memory cells in a wordline.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the storage element depends upon the data encoding scheme adopted for the storage elements.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 222 of FIG. 2A, the program voltage will also be applied to the control gates of storage elements 244 and 254.

Figure 3:
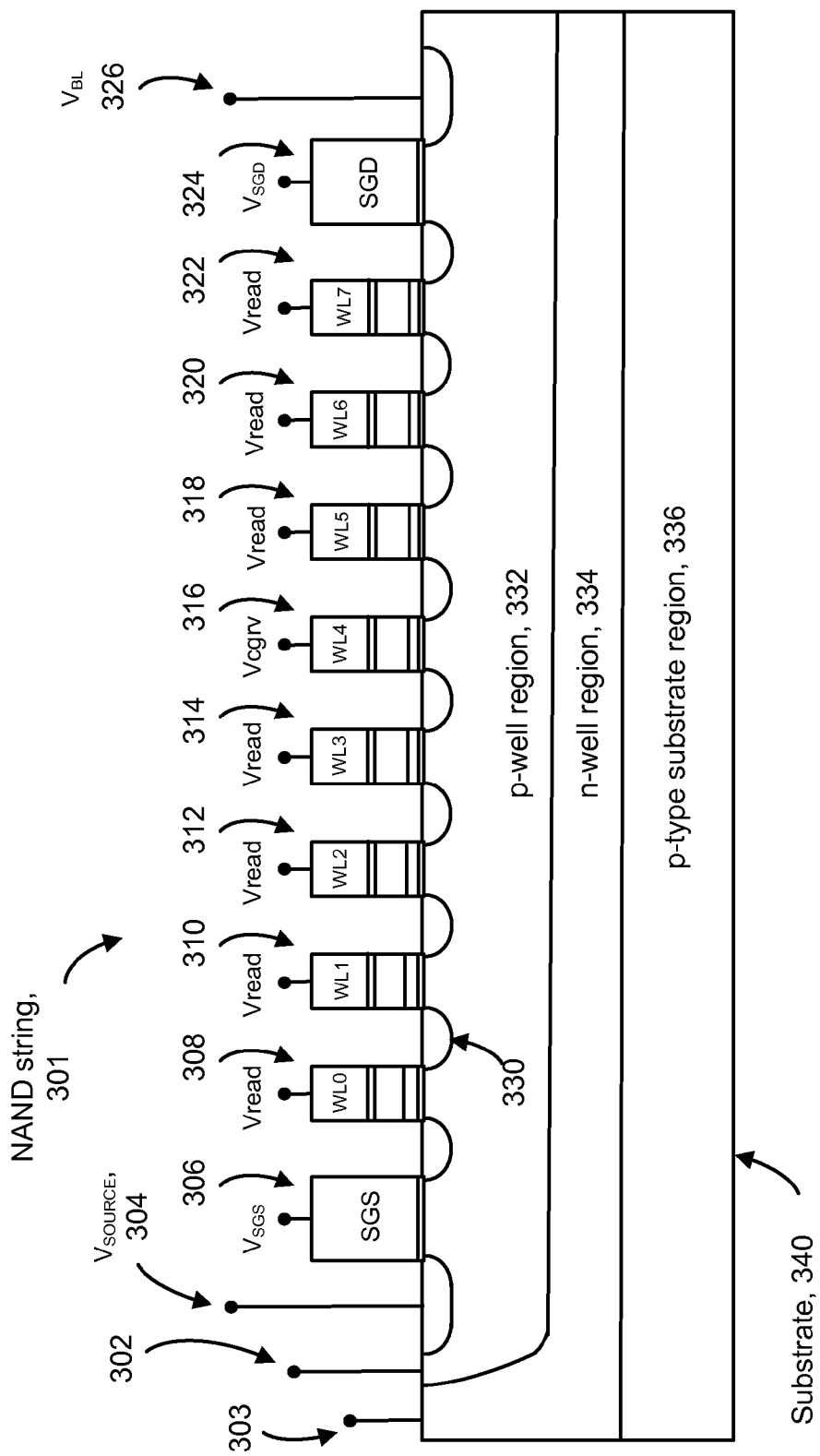
FIG. 3 depicts a cross-sectional view of a NAND string formed on a substrate.

FIG. 3 depicts a cross-sectional view of a NAND string formed on a substrate. The view is simplified and not to scale. The NAND string 301 includes a source-side select gate 306, a drain-side select gate 324, and eight storage elements 308, 310, 312, 314, 316, 318, 320 and 322, formed on a substrate 340. A number of source/drain regions, one example of which is source/drain region 330, are provided on either side of each storage element and the select gates 306 and 324.

In one approach, the substrate 340 employs a triple-well technology which includes a p-well region 332 within an n-well region 334, which in turn is within a p-type substrate region 336. The NAND string and its non-volatile storage elements can be formed, at least in part, on the p-well region. A source supply line 304 with a potential of $V_{SOURCE}$ is provided in addition to a bit line 326 with a potential of $V_{BL}$. Voltages, such as body bias voltages, can also be applied to the p-well region 332 via a terminal 302 and/or to the n-well region 334 via a terminal 303. During a read or verify operation, a control gate voltage $V_{CGRV}$ is provided on a selected word line, in this example, WL4, which is associated with storage element 316. Further, recall that the control gate of a storage element may be provided as a portion of the word line. For example, WL0, WL1, WL2, WL3, WL4, WL5, WL6 and WL7 can extend via the control gates of storage elements 308, 310, 312, 314, 316, 318, 320 and 322, respectively. A pass voltage, $V_{READ}$ is applied to the remaining word lines associated with NAND string 301. $V_{SGS}$ and $V_{SGD}$ are applied to the select gates 306 and 324, respectively.

Figure 4:
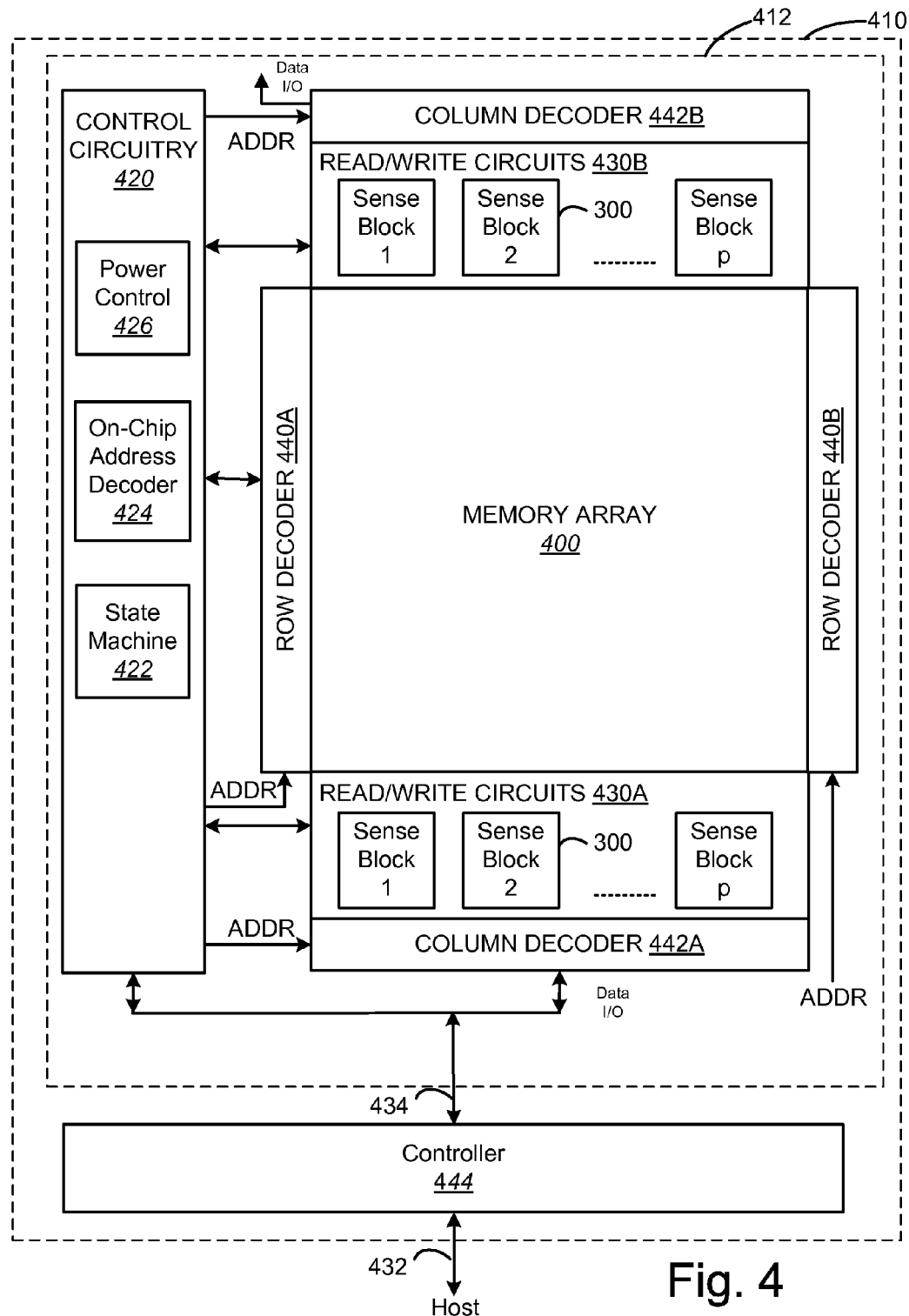
FIG. 4 illustrates a non-volatile storage device that may include one or more memory die or chips.

FIG. 4 illustrates a non-volatile storage device 410 that may include one or more memory die or chips 412. Memory die 412 includes an array (two-dimensional or three dimensional) of memory cells 400, control circuitry 420, and read/write circuits 430A and 430B. In one embodiment, access to the memory array 400 by the various peripheral circuits is implemented in a symmetric fashion, on opposite sides of the array, so that the densities of access lines and circuitry on each side are reduced by half. The read/write circuits 430A and 430B include multiple sense blocks 300 which allow a page of memory cells to be read or programmed in parallel. The memory array 400 is addressable by word lines via row decoders 440A and 440B and by bit lines via column decoders 442A and 442B. In a typical embodiment, a controller 444 is included in the same memory device 410 (e.g., a removable storage card or package) as the one or more memory die 412. Commands and data are transferred between the host and controller 444 via lines 432 and between the controller and the one or more memory die 412 via lines 434. One implementation can include multiple chips 412.

Control circuitry 420 cooperates with the read/write circuits 430A and 430B to perform memory operations on the memory array 400. The control circuitry 420 includes a state machine 422, an on-chip address decoder 424 and a power control module 426. The state machine 422 provides chip-level control of memory operations. The on-chip address decoder 424 provides an address interface to convert between the address that is used by the host or a memory controller to the hardware address used by the decoders 440A, 440B, 442A, and 442B. The power control module 426 controls the power and voltages supplied to the word lines and bit lines during memory operations. In one embodiment, power control module 426 includes one or more charge pumps that can create voltages larger than the supply voltage.

In one embodiment, one or any combination of control circuitry 420, power control circuit 426, decoder circuit 424, state machine circuit 422, decoder circuit 442A, decoder circuit 442B, decoder circuit 440A, decoder circuit 440B, read/write circuits 430A, read/write circuits 430B, and/or controller 444 can be referred to as one or more managing circuits.

Figure 5:
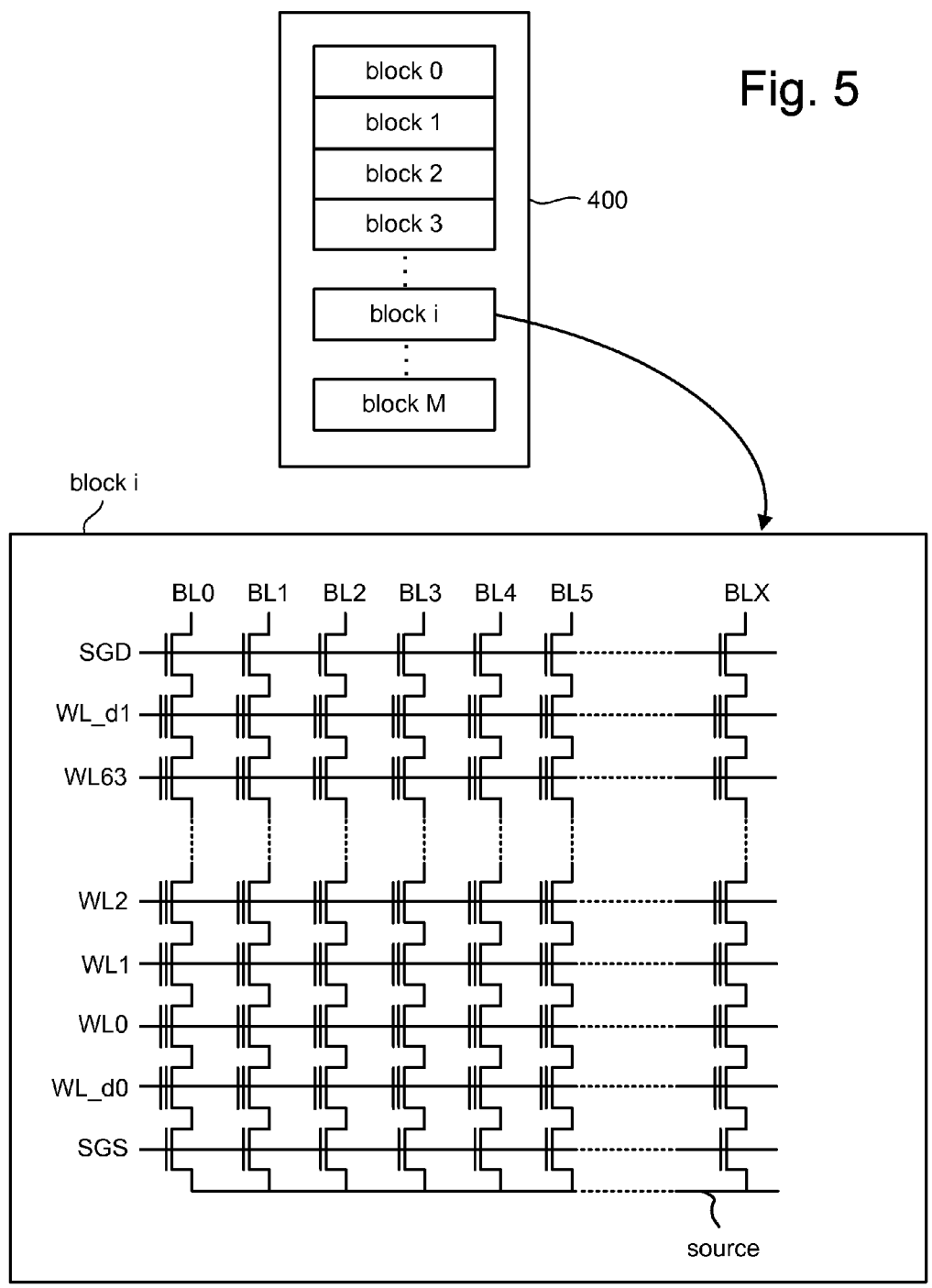
FIG. 5 depicts an exemplary structure of memory cell array.

FIG. 5 depicts an exemplary structure of memory cell array 400. In one embodiment, the array of memory cells is divided into M+1 blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes parity bits of an Error Correction Code (ECC) that have been calculated from the user data of the sector. A portion of the controller (described below) calculates the ECC parity when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 5 also shows more details of block i of memory array 400. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and more or fewer dummy memory cells. Data memory cells can store user or system data. Dummy memory cells are typically not used to store user or system data. Some embodiments do not include dummy memory cells.

Figure 6:
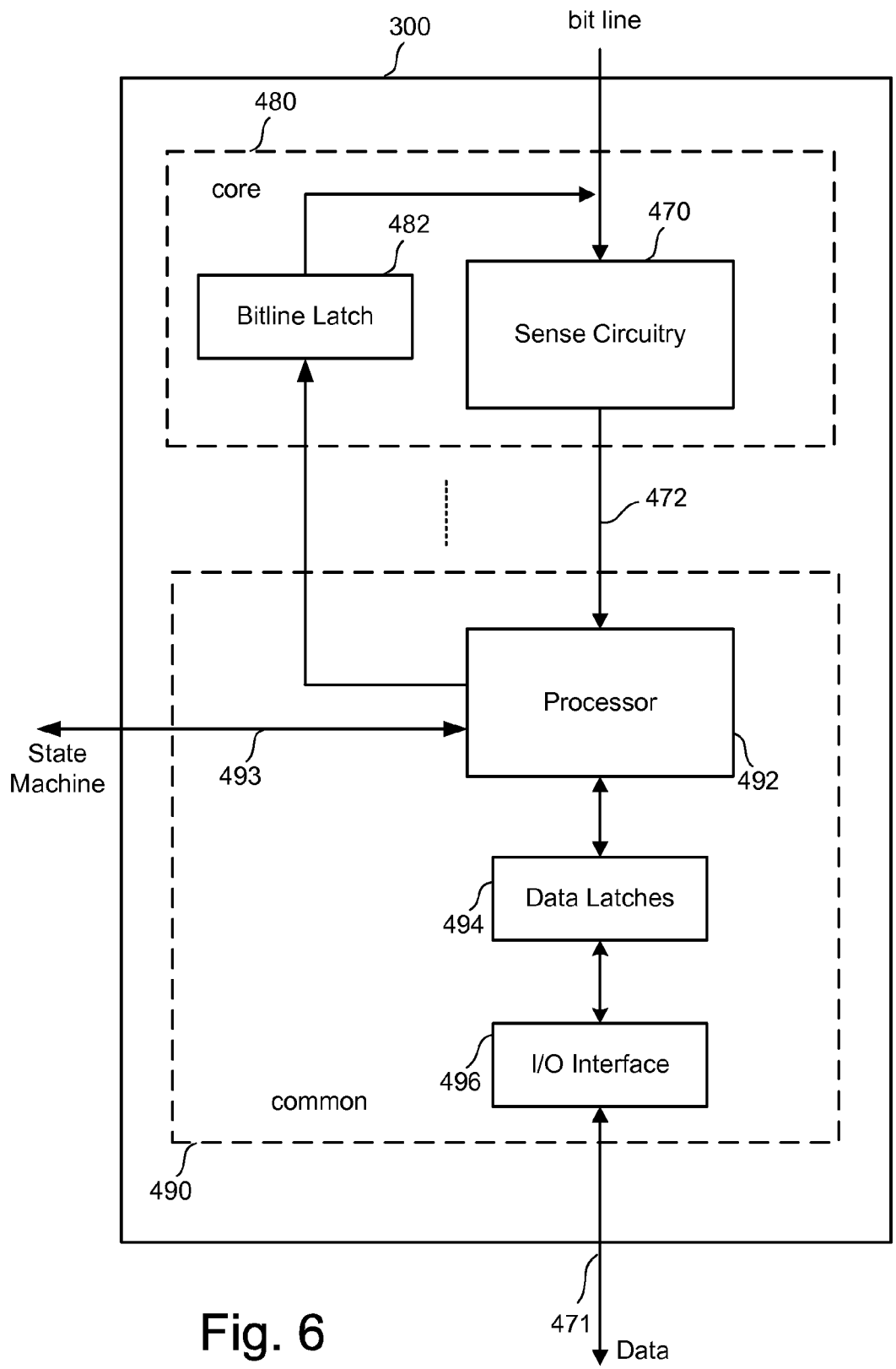
FIG. 6 is a block diagram of an individual sense block.

FIG. 6 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, filed Dec. 29, 2004, and titled, "Non-volatile memory and method with shared processing for an aggregate of read/write circuits," which is hereby incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 471. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 471 during a program operation. The imported data bits represent write data meant to be programmed into the memory. I/O interface 496 provides an interface between data latches 494 and the data bus 471.

During read or sensing, the operation of the system is under the control of state machine 422 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 6) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 471. The program operation, under the control of the state machine, comprises a series of programming voltage pulses (with increasing magnitudes) applied to the control gates of the addressed memory cells. Each programming pulse may be followed by a verify process to determine if the memory cell has been programmed to the desired state. Processor 492 monitors the verified memory state relative to the desired memory state. When the two are in agreement, processor 492 may set the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are 3-5 (or another number) data latches per sense module 480. In one embodiment, the latches are each one bit. In some implementations (but not required), the data latches are implemented as a shift register so that the parallel data stored therein is converted to serial data for data bus 471, and vice versa. In one embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

Figure 7:
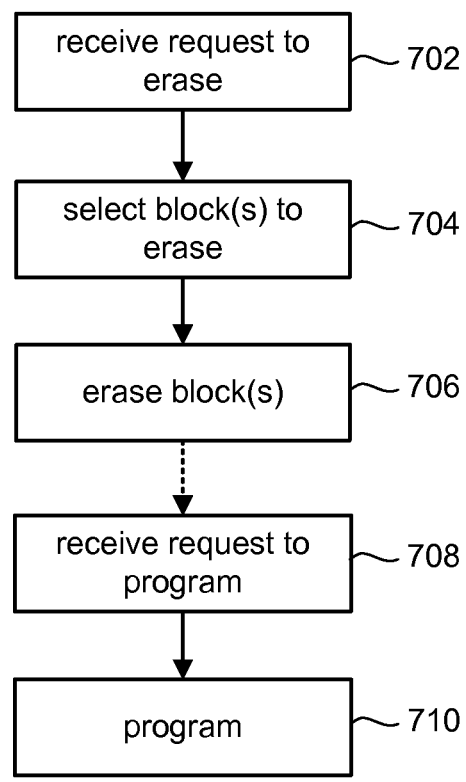
FIG. 7 is a flow chart describing one embodiment of a process for erasing and programming memory cells.
Figure 8:
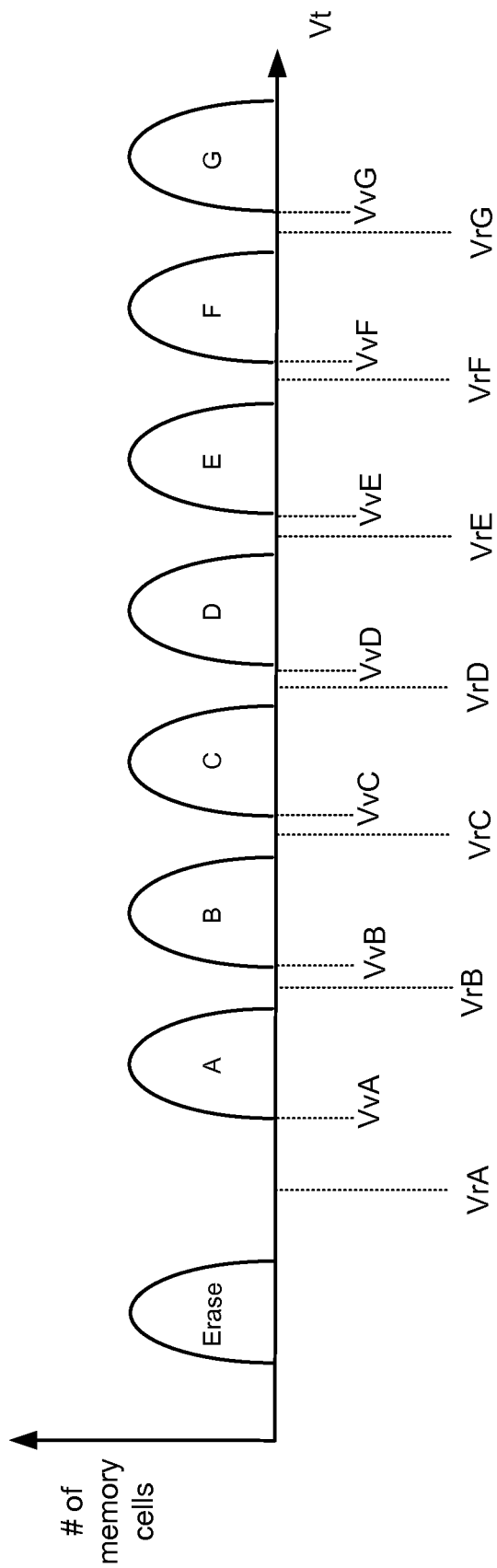
FIG. 8 depicts example threshold voltage distributions for states of memory cells in which there are eight states.

FIG. 7 is a flow chart describing one embodiment of a process for erasing and programming memory cells. The process of FIG. 7 is performed by the one or more managing circuits described above. In step 702, the system will receive a request to erase data. In one embodiment, it is possible that there will not be a dedicated erase command. Rather, the system will erase (prior to programming) in response to a request to program. In step 704, the blocks to be erased are selected. In step 706, the memory cells are erased. FIG. 8 depicts one embodiment of erasing memory cells.

In step 708 of FIG. 7, the system will receive a request to program data. A dotted line is depicted to connect step 706 to step 708 because there could possibly be a long time lapse between the two steps. In step 710, the memory cells will be programmed. The memory cells can be programmed in step 710 according to many of various programming methods known in the art.

At the end of a successful programming process (with verification), the threshold voltages of the memory cells should be within one or more distributions of threshold voltages for programmed memory cells or within a distribution of threshold voltages for erased memory cells, as appropriate. FIG. 8 depicts example threshold voltage distributions for states of memory cells in which there are eight states. The eight data states include an erase state and program states A-G. In this example, three bits may be stored per memory cell. Between each of the data states are read reference voltages used for reading data from memory cells. For example, FIG. 8 shows read reference voltage Vra between data states erase and A, and Vrb between data states A and B. By testing whether the threshold voltage of a given memory cell is above or below the respective read reference voltages, the system can determine what state the memory cell is in. At or near the lower edge of each data state are verify reference voltages. For example, FIG. 8 shows VvA for state A and VvB for state B, etc. When programming memory cells to a given state, the system will test whether those memory cells have a threshold voltage greater than or equal to the verify reference voltage.

Figure 9:
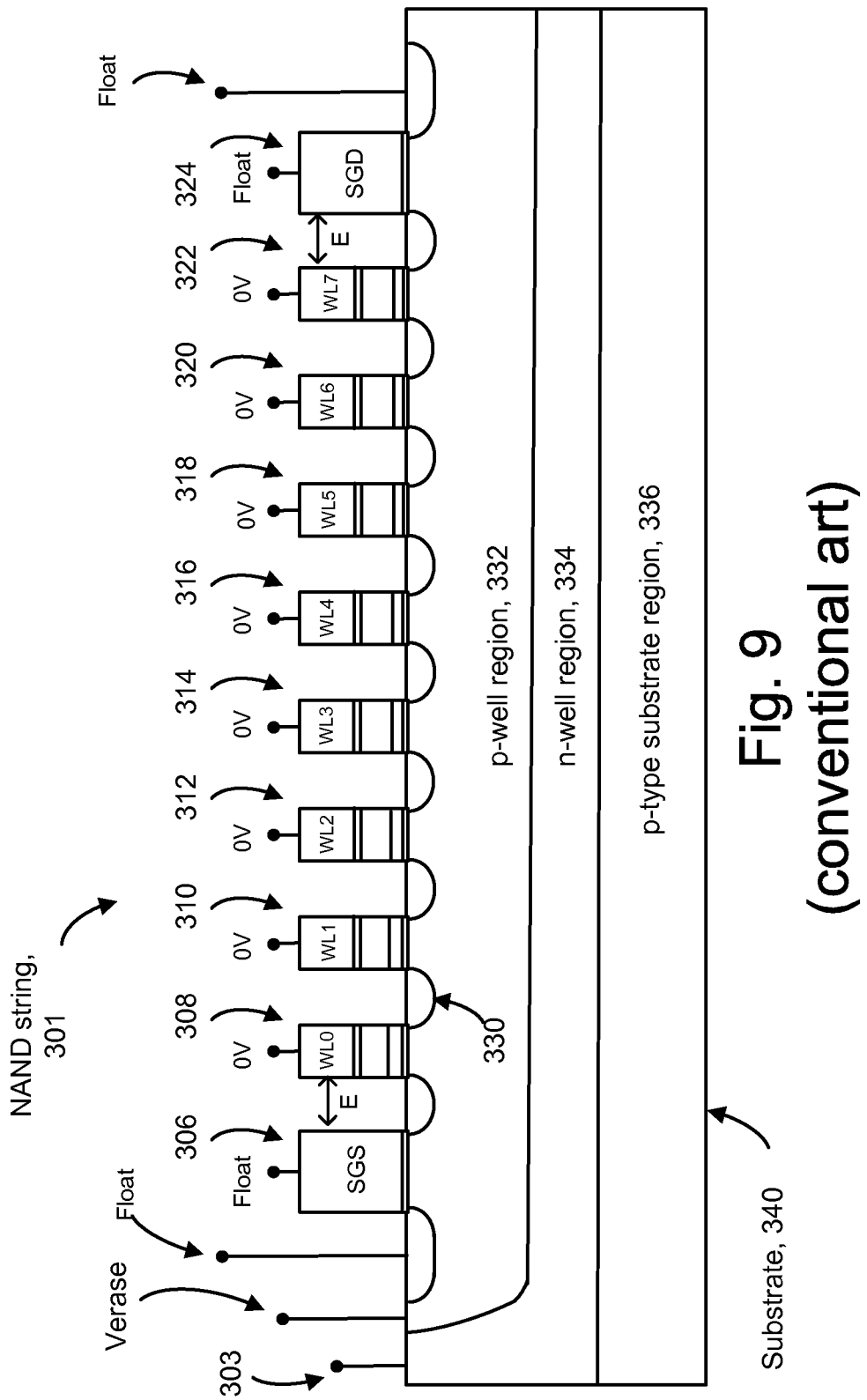
FIG. 9 is a diagram of a cross-sectional view of a NAND string used to illustrate various possible e-fields while erasing memory cells on the NAND string.

FIG. 9 is a diagram of a cross-sectional view of a NAND string used to illustrate various possible e-fields while erasing memory cells on the NAND string. The NAND string 301 includes a source-side select gate 306, a drain-side select gate 324, and eight storage elements 308, 310, 312, 314, 316, 318, 320 and 322, formed on a substrate 340. WL0 and WL7 may be referred to as edge word lines. WL1 and WL6 could also be referred to as edge word lines. In this context they may be referred to as second edge word lines. An edge word line may be a dummy word line that is not used to store user or system data. Regardless, it should be able to be erased. These dummy WLs may be used as GIDL (Gate Induced Drain Leakage) protection WLs during programming. Typically these dummy WLs are not used for data storage, but used to bias intermediate voltages between SGD potential and neighboring data WL allowing more durability for breakdown and GIDL. An edge word line could be a data word line, as opposed to a dummy word line.

Each memory cell has a tunnel oxide between the cell and the substrate 340. The select gates also have a tunnel oxide between the select gate and tunnel oxide. Sometimes, the select gate tunnel oxide is formed when the memory cell tunnel oxide is formed. Therefore, it may have about the same thickness as the memory cell tunnel oxide. Regardless of how and when it was formed, if too great of a voltage is applied across the tunnel oxide it may suffer damage.

During an erase operation, the p-well may be raised to a high voltage (for N-type memory cell). The word lines may be biased to a low voltage (e.g., 0V). A strong electric field is thus applied to the tunnel oxide layers of memory cells and the data of the memory cells are erased as electrons of the floating gates are emitted to the substrate, typically by Fowler-Nordheim tunneling mechanism. As electrons are transferred from the floating gate to the p-well region 332, the Vt of a selected cell may be lowered. Erasing can be performed on the entire memory array, on individual blocks, or another unit of cells. During the erase operation, the source and bit lines may be floating.

As noted above, the tunnel oxide of the select gate could be damaged if too great a voltage is applied across it. As one possibility, a relatively high bias may be applied to the select lines (e.g., SGS or SGD, generally referred to as "SG") during erase to prevent such a condition. However, it can be problematic to apply a high voltage to the select line during erase.

As another possibility, the select lines may be floated during erase. The high erase voltage applied to the p-well 332 may couple to the select line (SG) and raise its voltage. Therefore, the select gate tunnel oxide may be protected from damage since the voltage across it is reduced. Depending on how much of the voltage from the p-well region 332 couples up to the select line (SG), its voltage could be about at the p-well voltage (which is the erase voltage).

This select gate floating scheme may become problematic when NAND flash scales down. As NAND scales, word line and select line and spaces between are scaled down to smaller number. However, program and erase voltages cannot be easily reduced due to difficulties to downsize vertical dimensions (e.g., tunnel oxide, IPD thickness, floating gate height) due to fundamental characteristics of flash memory.

FIG. 9 shows an e-field between the drain select line (SGD) and an edge word line (WL7), as well as an e-field between the source select line (SGS) and an edge word line (WL0). These electric fields between the select line (SG) and edge WL may increase as memories scale under above voltage and dimension scaling limitations. Note that the space between SG and the edge word line may comprise an insulator, such as silicon oxide. As one alternative, an air gap may be used. However, even when using an air gap, there may be a layer of silicon oxide over the SG and the edge WL. If the electrical field is too large, damage may occur to the oxide. Also, there could be arcing across the gap between SGD and WL7 or between SGS and WL0.

This electrical field between SG and an edge WL during erase operation can be reduced by use of dummy WLs, as dummy WLs can be positively biased. This positive bias on dummy WLs may lead to a weaker erase, as FN tunneling field over the dummy memory cell tunnel oxide is also reduced. However, this may be acceptable since dummy WLs are typically kept erased during user operation.

Even using a dummy WL scheme, the electric field suppression between a select gate SG and an edge WL may be limited. In the case of a 20V Verase voltage, the electrical field between SG and the edge WL significantly increases as the space between SG and the edge WL space scales smaller. For some oxides, an electrical field of 8 MeV/cm to 10 MeV/cm or higher may be dangerous for assuring sufficient oxide reliability, which leads to Time Dependent Dielectric Breakdown (TDDB) or at worst case immediate breakdown. The result of this scaling is that the quality of the oxide should be as close to theoretically perfect as possible.

Figure 10:
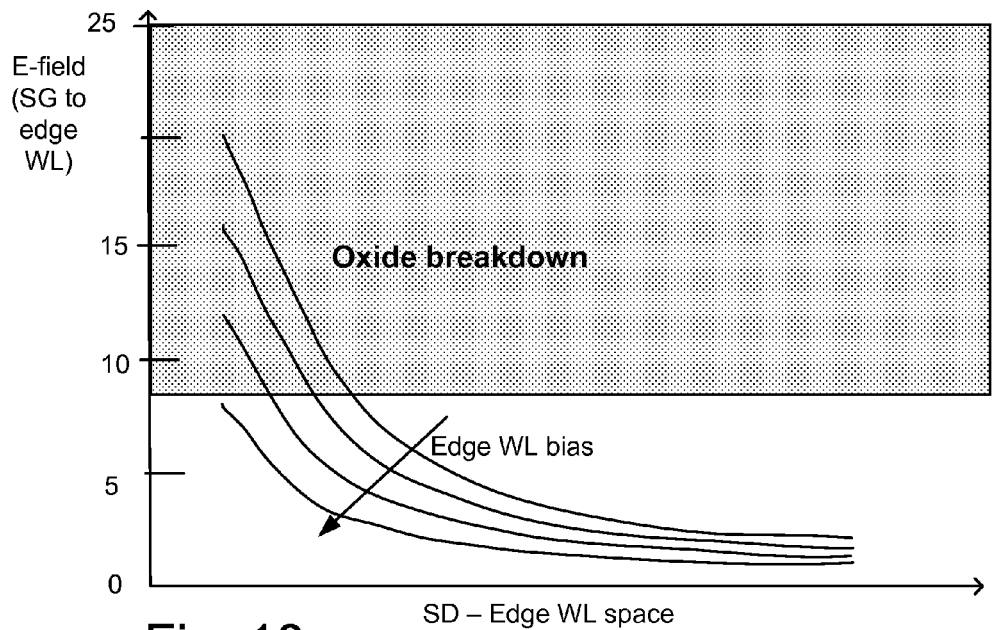
FIG. 10 shows a dependence of a theoretical electric field between SG and edge WL dependence on the space between SG and edge WL.

FIG. 10 shows how a theoretical electric field between a select line SG and an edge WL may depend on the space between the select line SG and edge WL. The erase voltage may be about 20V. This erase voltage is applied to the p-well 332 and will be assumed to couple to the select line SG, such that SG is at the p-well voltage.

Each curve in FIG. 10 is for a different edge word line bias. As NAND flash scales down in size, the electric field between the select line SG and edge WL space may increase dramatically. In general, an electric field above 8 to 10 MeV/cm may be considered as dangerous range to assure continuous usage. The curves in FIG. 10 demonstrate that if the space between SG and the edge WL is sufficiently large, then the e-field may be sufficiently low to prevent problems (even with a relatively high erase voltage of 20V). However, the curves may enter the oxide breakdown zone if the space is too small. Note that for the curves having a higher bias applied to the edge WL, the curve enters the oxide breakdown zone at a smaller gap size. Also note that the oxide breakdown could begin below or above the depicted level of about 8 MeV/cm.

Figure 11:
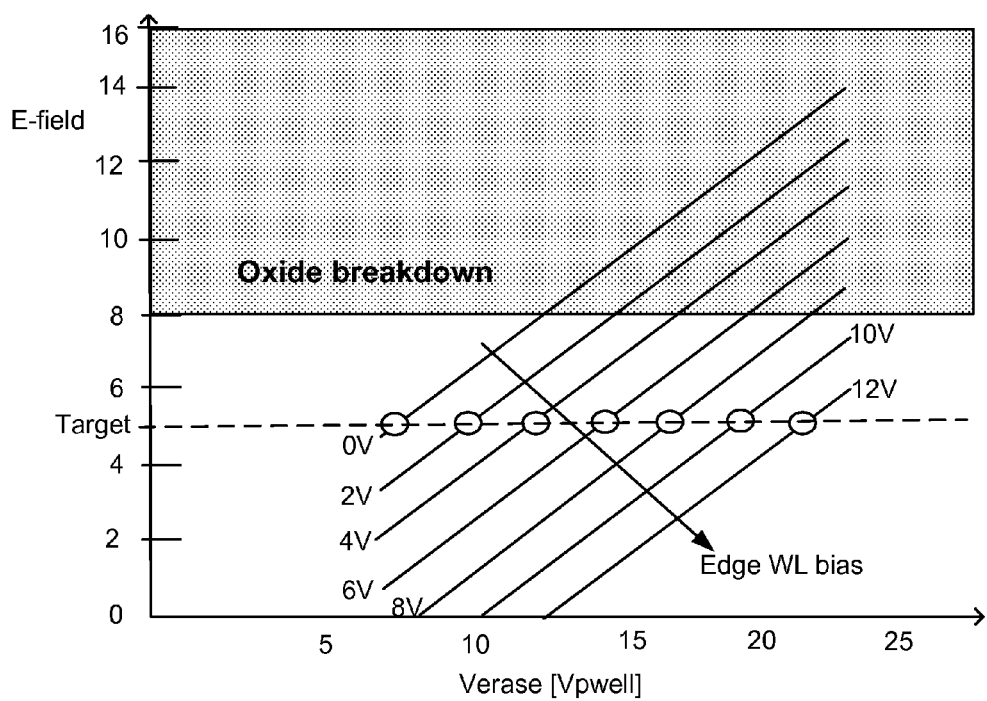
FIG. 11 shows the edge WL bias increased in conjunction with Verase.

In one embodiment, the voltage applied to an edge word line is increased with greater erase voltages. This may keep the magnitude of the e-field between the select line SG and the edge word line at a level that prevents or reduces damage to oxide (including oxide between the select line SG and edge WL). FIG. 11 depicts a theoretical electrical field between the select line (SG) and the edge WL as a function of Verase bias. Each of the curves represents a different voltage applied to the edge WL. The curves are each for the same gap between SG and the edge WL. In one embodiment, the electrical field between the select line SG and the edge WL, as well as FN tunneling electrical field across the tunnel oxide of the memory cells associated with the edge WL, is kept constant (or close to constant) by increasing the edge WL bias proportional to Verase (Vpwell).

FIG. 11 shows that if the edge WL bias is increased in conjunction with Verase (e.g., ramping up from 0V to 12V), a sufficiently low constant electrical field of about 5.5 MeV/cm may be maintained from a corresponding Verase of about 7V to 20V. Therefore, the e-field between SG and the edge WL should be low enough to not cause a breakdown. Note that the example of a target e-field of 5.5 MeV/cm is just one example. The target could be higher or lower. Also, it is not a requirement that the voltage applied to the edge WL maintain that target e-field.

Figure 12:
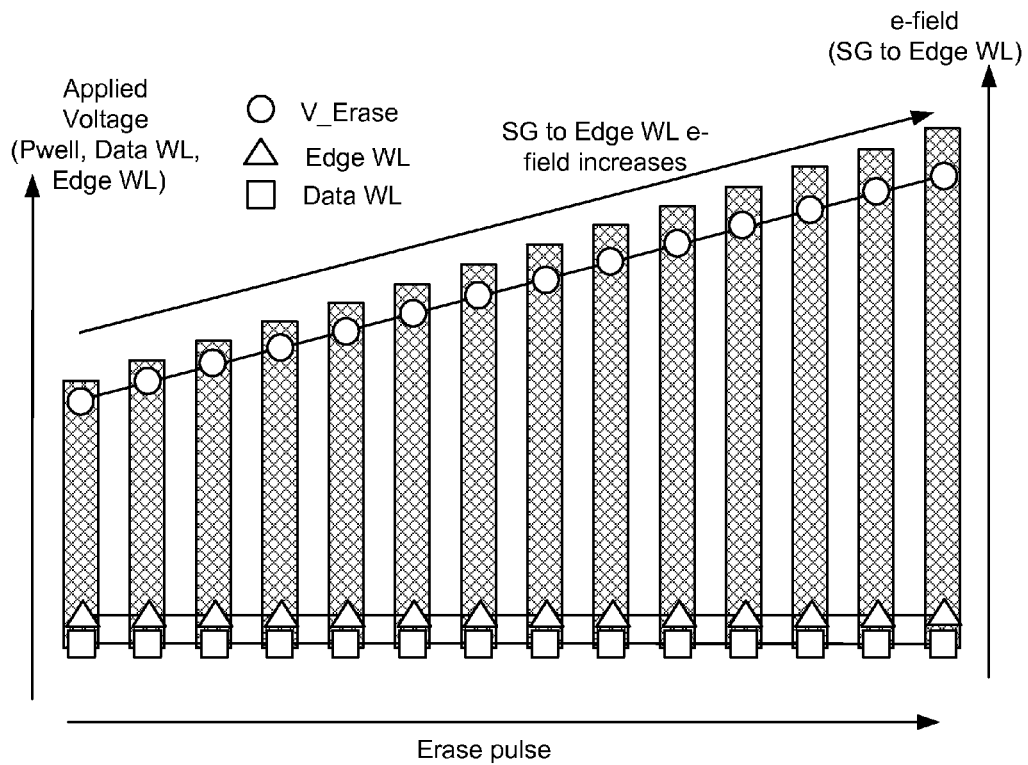
FIG. 12 is a diagram of voltages applied during a conventional erase procedure, as well as a resulting e-field between SG and the edge WL.

FIG. 12 is a diagram of voltages applied during a conventional erase procedure, as well as a resulting e-field between the select line SG and the edge WL. The sequence of erase voltages (V_erase) increase in magnitude as the sequence progresses. Voltages applied to the two word lines nearest SG are also depicted. The first edge word line may be a dummy word line, and the second edge word line may be a data word line. In this conventional example, a relatively low voltage is applied to the first edge word line and to the second edge word line. Moreover, conventionally, the voltage applied to these two word lines may be constant, irrespective of the erase voltage.

Note that the e-field between SG and the first edge word line increases in magnitude as the erase voltage increases in magnitude. As noted above, if the e-field becomes too large there may be problems, such as damage to oxide.

Figure 13:
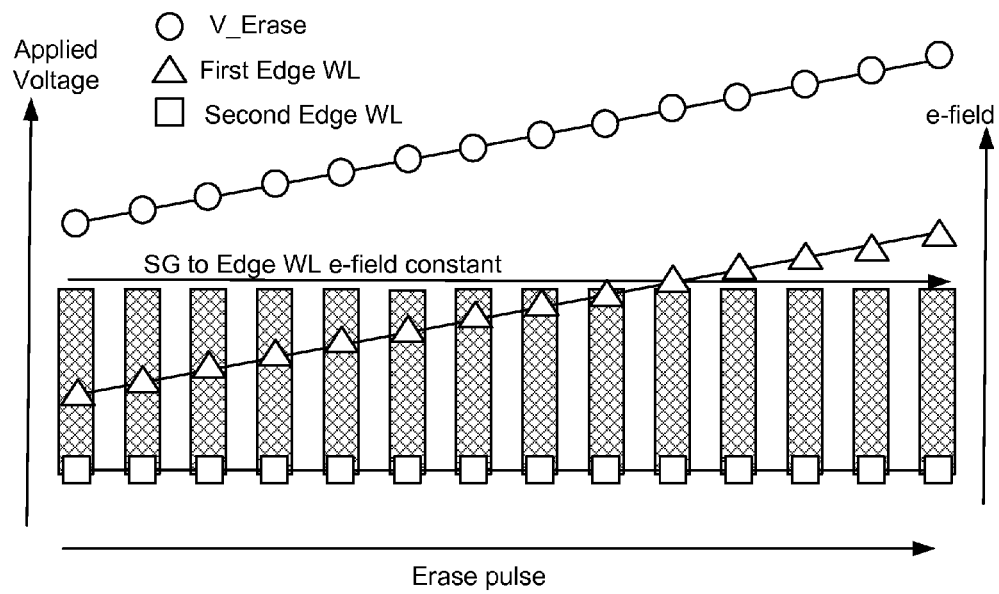
FIG. 13 is a diagram of voltages applied during one embodiment of an erase procedure, as well as a resulting e-field between SG and the edge WL.

FIG. 13 is a diagram of voltages applied during one embodiment of an erase procedure, as well as a resulting e-field between the select line SG and the edge WL. The sequence of erase voltages (V_erase) increase in magnitude as the sequence progresses. Voltages applied to the two word lines nearest the select line SG are also depicted. The select line may be SGS or SGD. The two word lines will be referred to as a "first edge word line" and a "second edge word line" in this context. The first edge word line may be a dummy word line, and the second edge word line may be a data word line. However, both edge word lines could be data word lines. Also, it is possible to have two or more dummy word lines next to the select line (SG).

In this embodiment, the voltage applied to the first edge word line increases in magnitude as the erase voltage increases in magnitude. Note that the e-field between the select line SG and the first edge word line as about constant in magnitude as the erase voltage increases in magnitude. However, it is not a requirement that the e-field be kept perfectly constant. In one embodiment, the increase in the magnitude of the voltage applied to the first edge word line increases more slowly such that the e-field increases somewhat as the erase voltage increases in magnitude.

In this embodiment, a relatively low voltage is applied to the second edge word line. This may be about 0V, but could be higher or lower. This low voltage helps to erase the memory cells associated with the second edge word line. This voltage may be constant as the erase voltage increases in magnitude, but that is not a requirement. In one embodiment, the voltage on the second edge word line is increased as the erase voltage increases in magnitude. In one embodiment, the voltage on the second edge word line is decreased as the erase voltage increases in magnitude.

Figure 14:
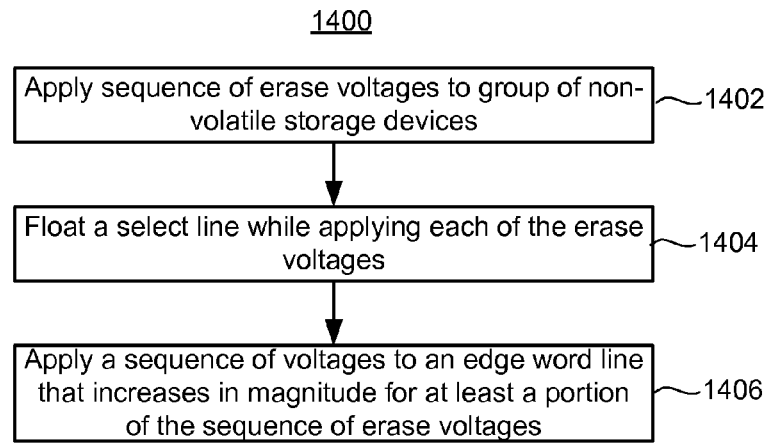
FIG. 14 is a flowchart of one embodiment of a process of erasing non-volatile storage.

FIG. 14 is a flowchart of one embodiment of a process 1400 of erasing non-volatile storage. In one embodiment, voltages applied are similar to those described in FIG. 13. However, process 1400 is not limited to those voltages. Voltages such as those depicted in FIGS. 16-18, to be discussed below, could also be used. Still other voltages could be applied.

In step 1402, a sequence of erase voltages are applied to a group of non-volatile storage elements. The erase voltage increase in magnitude as the sequence progresses. The group of non-volatile storage elements are associated with word lines and a select line. In one embodiment, the group of non-volatile storage elements are part of a number of NAND strings. The word lines include a first edge word line that is adjacent to the select line. The first edge word line may be a dummy word line, but that is not required.

In step 1404, the select line is floated while applying each of the erase voltages in the sequence. Referring to FIG. 5, either or both of SGD and SGS may be floated.

In step 1406, a voltage is applied to the first edge word line while applying each of the erase voltages in the sequence. The voltage applied to the first edge word line increases in magnitude relative to a previous voltage applied to the first edge word line for at least a portion of the sequence of erase voltages. Referring to FIG. 5, the voltage may be applied to either or both of WL_d1 and WL_d0. In one embodiment, if SGD is floated in step 1404, then the voltage is applied to WL_d1. In one embodiment, if SGS is floated in step 1404, then the voltage is applied to WL_d0.

Figure 15:
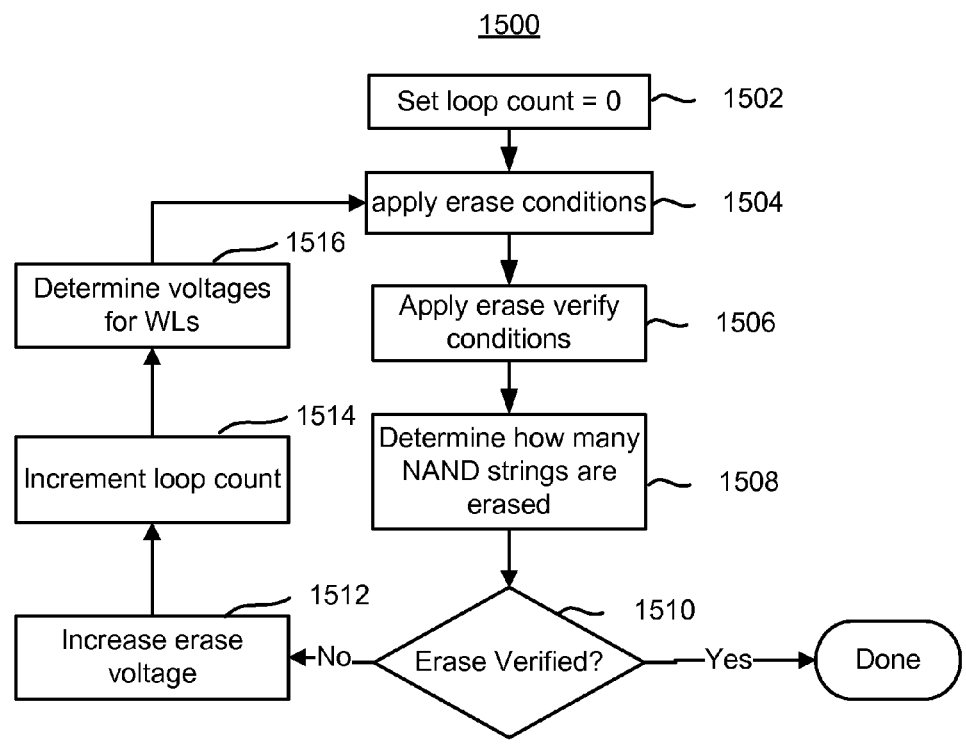
FIG. 15 is a flow chart describing a process for erasing and verifying that the memory cells have been erased.

FIG. 15 is a flow chart describing a process 1500 for erasing and verifying that the memory cells have been erased. The process 1500 is applied to a block of memory cells that are arranged as NAND strings, in one embodiment. The process 1500 loops until erase is verified, with each loop applying erase conditions.

In step 1502, a loop count is initialized. This erase count may be used to determine a suitable magnitude for a voltage for the edge word line.

In step 1504, erase conditions are applied. These conditions may include an erase voltage or pulse to the p-well 332, and suitable voltages to the word lines. Different voltages may be applied to the word lines based on their location. Also, the word line voltage may depend on the erase loop count or on the erase voltage magnitude. Further details are discussed below. In one embodiment, the erase conditions include floating SGS, SGD, the bit lines, and the common source line.

In step 1506, a set of erase verify conditions are applied to the memory cells. In one embodiment, source follower sensing is employed. Step 1506 may include discharging bit lines to ground, which may be achieved by turning on the drain side select line (SGD). Then, a higher than zero voltage (e.g., 2.2V) is applied to the common source line and a certain voltage (e.g., 0V) is applied to the word lines. Charge builds up on the bit line of a given NAND string until the body effect turns off at least one memory cell in the NAND string. The memory cells may be sensed in another manner.

In step 1508, each of the NAND strings is sensed to determine whether all of the memory cells on the NAND string were sufficiently erased. Step 1508 may be performed after waiting for a predetermined period of time for the charge to build up on the bit line. In one embodiment, the voltage on a given bit line is compared to a reference value to determine whether any of the memory cells on the corresponding NAND string have a Vt that is above the target value. The target value could be a negative value.

In one embodiment, if it is detected that the Vt of each memory cell on a NAND string has reached the target level, then the data stored in the corresponding data latch is changed to a logic "1." If the NAND string has at least one memory cell with a Vt that has not reached the appropriate target level, the data stored in the corresponding data latch is not changed, in one embodiment.

In step 1510, a determination is made as to whether enough NAND strings passed erase verification. In one implementation, a certain number of NAND strings are allowed to fail erase verification. For example, providing that fewer than 32 NAND strings failed erase verification, the overall erase verification passes. If erase verify passed, then the process concludes.

If, at step 1510, it is determined that erase verification failed, then the erase voltage is increased in step 1510. The erase voltage can be increased by any desired amount such as 0.2 V, 0.5 V, 1.0 V, etc.

In step 1514, the erase loop count is incremented. In step 1516, voltages to apply to the various word lines are determined. As noted above, different voltages may be applied to the word lines based on their location. For example, the voltage applied to the first edge word line may different from that applied to the second edge word line. Also, the word line voltage may depend on the erase loop count or on the erase voltage magnitude. For example, edge word lines may receive a voltage that depends on erase loop count or erase pulse magnitude, whereas middle word lines (those not considered to be at the edge) may have voltage that does not depend on the erase loop count or voltage.

Next, the erase conditions are applied in step 1504. Then, the process continues until erase is verified. In one embodiment, if the erase loop count exceeds some pre-determined number prior to erase verify passes, the process concludes with erase failure.

Figure 16:
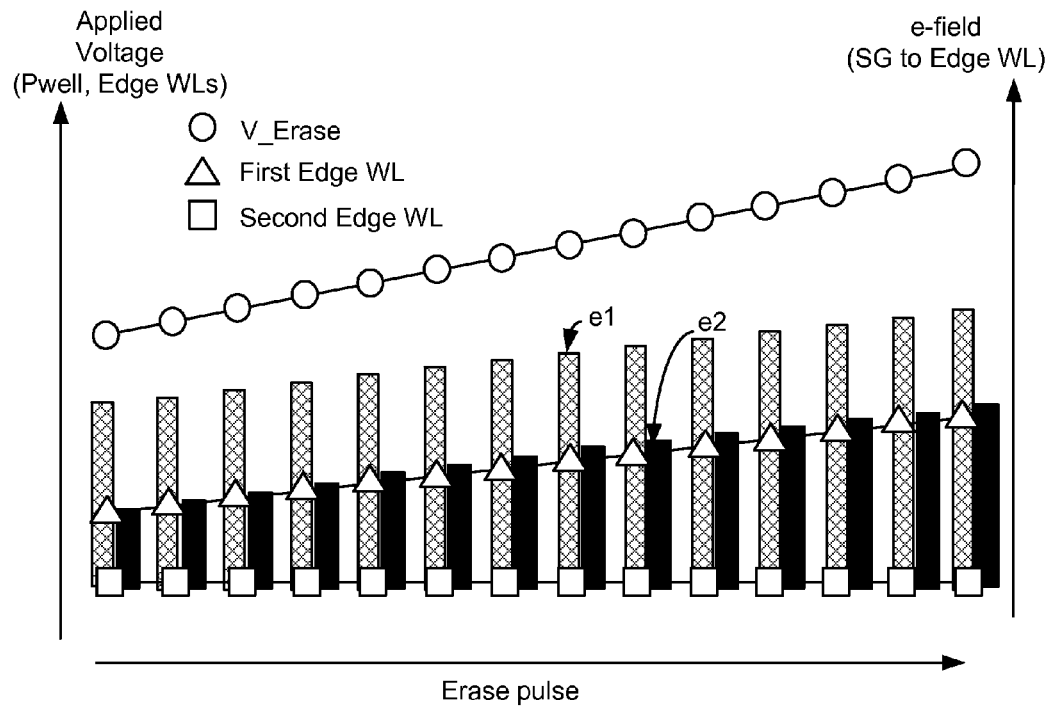
FIG. 16 is a diagram of voltages applied during one embodiment of an erase procedure, as well as a resulting e-field between SG and the edge WL.

As noted above, the voltage applied to the first edge word line does not need to keep the e-field between the select line SG and the edge WL constant, although that is one possibility. FIG. 16 is a diagram of voltages applied during one embodiment of an erase procedure, as well as a resulting e-field between SG and the edge WL. In this embodiment, the voltage applied to the first edge word line does not increase as much as the erase voltage does from one pulse to the next. For example, the erase voltage might increase by 0.4V from one erase pulse to the next, whereas the voltage applied to the first edge word might increase from 0.2V from one erase to the next. The e-field between the select line SG and the first edge WL may increase as erase progresses. This is depicted as "e1" in FIG. 16.

In this embodiment, a relatively low voltage is applied to the second edge word line. This may be about 0V, but could be higher or lower. This low voltage helps to erase the memory cells associated with the second edge word line.

The e-field between the first edge WL and the second edge WL is also depicted. This is depicted as "e2" in FIG. 16. This e-field may increase as erase progresses. A reason for this increase is the increasing difference between the voltage applied to the first edge WL and the second edge WL, as erase progresses. However, note that increases in magnitude of the voltage applied to the first edge word line may be kept smaller than the increases in magnitude of the erase voltages. Thus, the increases to the e-field between the first and second edge WLs can be kept smaller. This can help to prevent or reduce breakdown of an insulator (e.g., a dielectric such as silicon oxide) between the first and second edge word lines.

Figure 17:
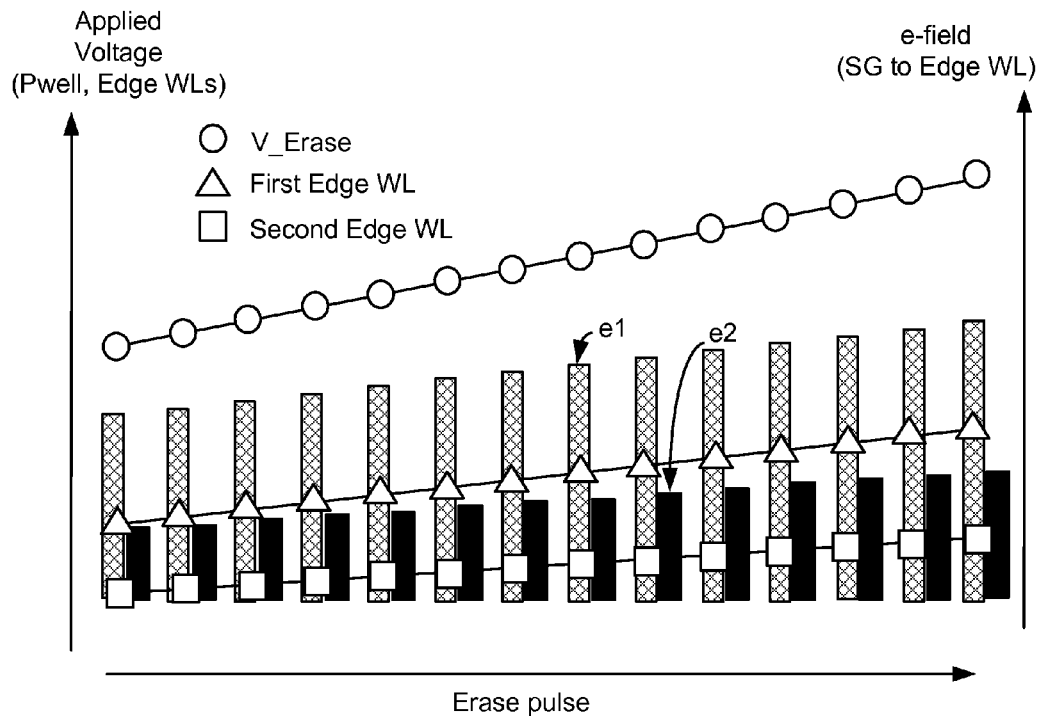
FIG. 17 is a diagram of voltages applied during one embodiment of an erase procedure, as well as a resulting e-field between SG and the edge WL.

FIG. 17 is a diagram of voltages applied during one embodiment of an erase procedure, as well as a resulting e-field between SG and the edge WL. In this embodiment, the voltage applied to the second edge word line increases from one erase pulse to the next. This can help to reduce the e-field between the first edge WL and the second edge WL.

In this embodiment, the voltage applied to the first edge word line does not increase as much as the erase voltage does from one pulse to the next. The e-field between SG and the first edge WL (e1) may increase as erase progresses.

The e-field between the first edge WL and the second edge WL is also depicted. This e-field (e2) may increase as erase progresses. However, because the voltage applied to the second edge word line is increased as the sequence of erase pulses progresses, the increases to the e-field between the first and second edge WLs can be kept smaller. This can help to prevent or reduce breakdown of an insulator (e.g., a dielectric such as silicon oxide) between the first and second edge word lines.

In the embodiment of FIG. 17, the voltage applied to the second edge WL increased, but by smaller increments than the increases of the voltage applied to the first edge word line. This concept may be extended to other edge word lines. For example, the voltage applied to the third edge word line may increase as erase progresses. However, this could be by smaller increments than the increases of the voltage applied to the second edge word line. Thus, the magnitude of the voltage increase may be less for edge word lines that are further from the first edge word line.

Note that if the first edge WL voltage is stepped up with increases to V_erase, it could potentially slow down the erase speed of memory cells associated with the second edge WL, due to WL to floating gate (FG) coupling. For example, the first edge WL can capacitively couple to the FG of memory cells associated with the second edge WL. If the second edge WL is a data WL, then slowing down the erase speed may not be desirable. In one embodiment, the voltage to the second edge WL is stepped down as erase progresses.

Figure 18:
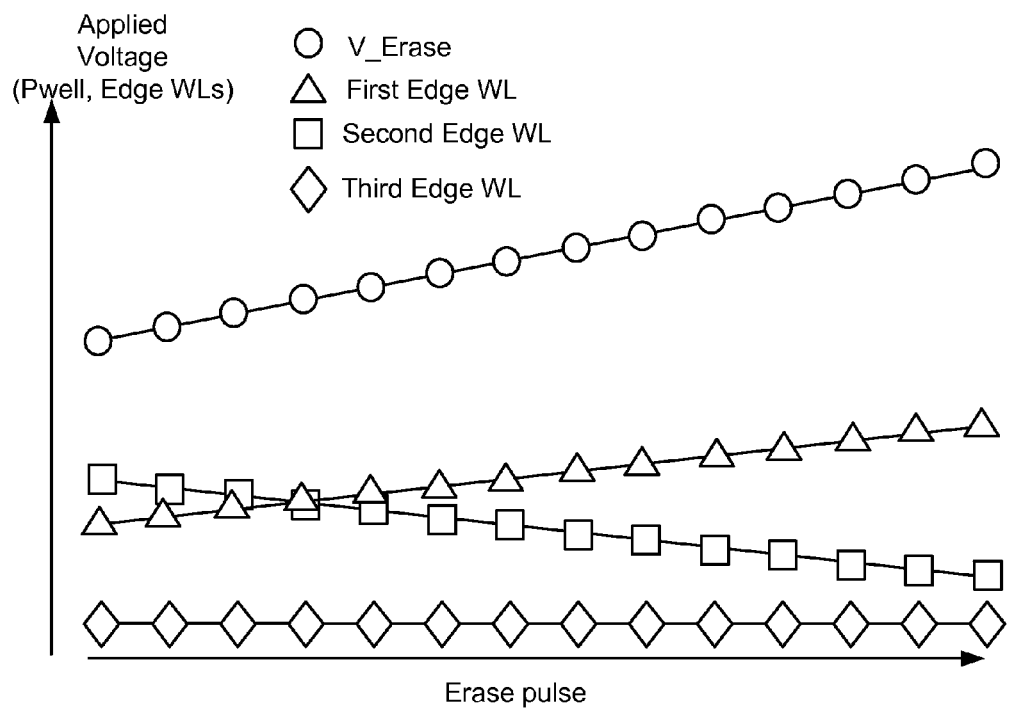
FIG. 18 is a diagram of voltages applied during one embodiment of an erase procedure, in which voltages applied to the second edge WL are stepped down as erase progresses.

FIG. 18 is a diagram of voltages applied during one embodiment of an erase procedure, in which voltages applied to the second edge WL are stepped down as erase progresses. The increasing erase voltages (pulses) are depicted, along with increases of the voltage applied to the first edge WL. The increases to the first edge WL may be smaller in magnitude than the increases to the erase voltages from one pulse to the next.

In the embodiment of FIG. 18, the voltage applied to the second edge WL decreases with greater magnitude erase voltages. The initial magnitude of the voltage applied to the second edge word line may be greater than that applied to the first edge WL, but as an alternative it could be smaller or the same size.

In the embodiment depicted in FIG. 18, the voltage applied to the third edge WL is kept constant throughout the erase sequence. However, the voltage applied to the third edge WL could be increased or decreased as erase progresses.

Note that if the voltage to a WL is to be increased as erase progresses, the increases do not need to occur with each new erase pulse. The increases could start only after a pre-determined number of erase pulses or only after the magnitude of the erase pulse has reached some level. Also, the increases could stop after a pre-determined number of erase pulses or after the magnitude of the erase pulse has reached some level. These two factors can be combined. Likewise, similar actions can be performed if the WL voltage is to be decreased as erase progresses.

Figure 19A:
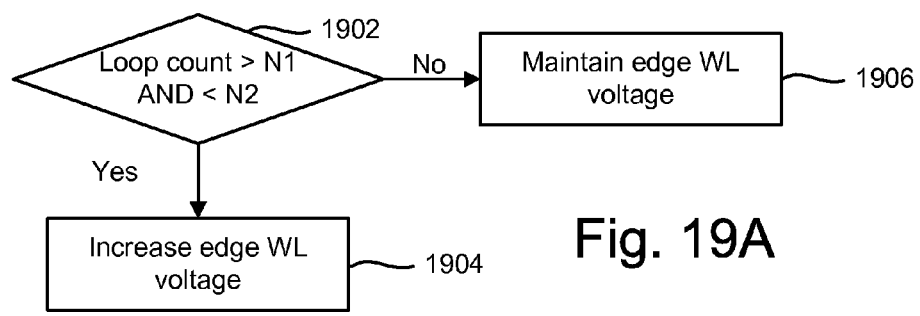
FIG. 19A is a flowchart of one embodiment of a process of determining whether to increase a WL voltage.

FIG. 19A is a flowchart of one embodiment of a process of determining whether to increase a WL voltage during an erase operation. This process may be performed for a first edge WL, second edge WL, etc. The process can be used in step 1516 of process 1500. The process could be used with ramping schemes to the edge WL voltages such as depicted in FIG. 13, 16, 17, 18, but is not limited thereto. However, the edge WL voltage may be kept constant at lower and/or higher erase voltages rather than ramping.

In step 1902, a determination is made whether the erase loop count is greater than N1 but less than N2. If so, the edge WL voltage is increased in step 1904. The increase may depend on which word line this is for. In one embodiment, the increase is the same magnitude (or approximately the same) as the increase of the erase voltage. This may be the case for the first edge WL. In one embodiment, the increase is smaller in magnitude than the increase of the erase voltage. Note that an alternative to increasing the edge WL voltage is to decrease it, as in the example of FIG. 18 for the second edge WL.

If the test of step 1902 is false, then the edge WL is maintained at its previous level in step 1906. Note that N1 can be any number, including 0, such that on the first erase pulse the edge WL voltage is increased. N2 could be any number greater than N1, including a number higher than the highest possible erase loop count.

Figure 19B:
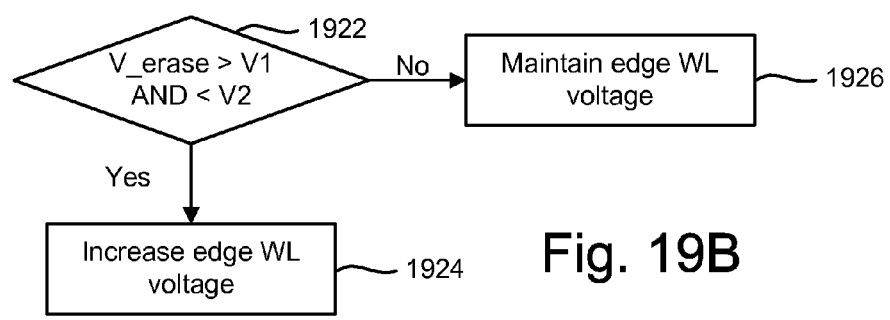
FIG. 19B is a flowchart of one embodiment of a process of determining whether to increase a WL voltage.

FIG. 19B is a flowchart of one embodiment of a process of determining whether to increase an edge WL voltage during erase. This process may be performed for a first edge WL, second edge WL, etc. The process can be used in step 1516 of process 1500. This process is similar to the one of FIG. 19A, but is based on erase pulse magnitude. The process could be used with ramping schemes to the edge WL voltages such as depicted in FIG. 13, 16, 17, 18, but is not limited thereto.

In step 1922, a determination is made whether the erase pulse magnitude is greater than V1 but less than V2. Note that V1 can be any voltage, including lower than the lowest possible V_erase, such that on the first erase pulse the voltage is increase. V2 could be any voltage greater than V1, including higher than the highest possible V_erase.

If the erase pulse magnitude is greater than V1 but less than V2, the edge WL voltage is increased in step 1924. The increase may depend on which word line this is for. In one embodiment, the increase is the same magnitude as the increase of the erase voltage. This may be the case for the first edge WL. In one embodiment, the increase is smaller in magnitude than the increase of the erase voltage. Note that an alternative to increasing the edge WL voltage is to decrease it, as in the example of FIG. 18 for the second edge WL. If the test of step 1922 is false, then the edge WL is maintained at its previous level in step 1926.

Figure 19C:
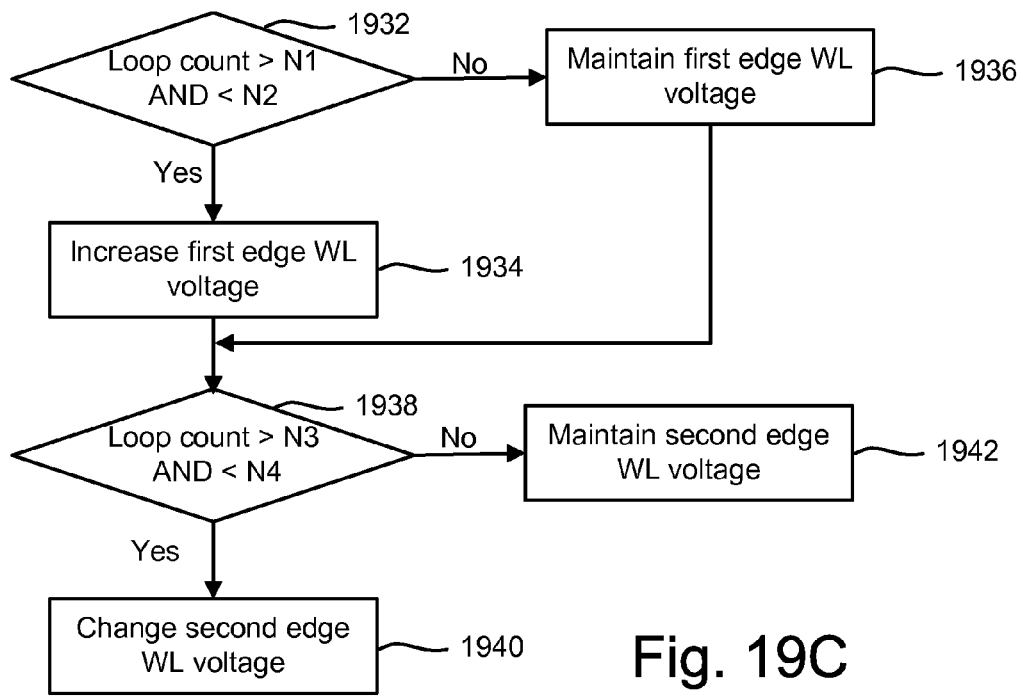
FIG. 19C is a flowchart of one embodiment of a process in which the first and second edge WLs have different start/stop points.

The points at which the voltages start/stop changing can be different for different edge WLs. FIG. 19C is a flowchart of one embodiment of a process in which the first and second edge WLs have different start/stop points. In step 1932, a determination is made whether the erase loop count is greater than N1 but less than N2. If so, the first edge WL voltage is increased in step 1934. If the test of step 1932 is false, then the first edge WL is maintained at its previous level in step 1936. Note that N1 can be any number, including 0, such that on the first erase pulse the voltage is increase. N2 could be any number greater than N1, including a number higher than the highest possible erase loop count. The N1 and N2 in this process are not necessarily the same as those referenced in the process of FIG. 19A.

In step 1938, a determination is made whether the erase loop count is greater than N3 but less than N4. Note that N3 can be any number, including 0, such that on the first erase pulse the voltage is increase. N4 could be any number greater than N3, including a number higher than the highest possible erase loop count.

If the test of step 1938 is true, the second edge WL voltage is changed in step 1940. This change could be an increase or a decrease. If the test of step 1938 is false, then the second edge WL is maintained at its previous level in step 1942.

Figure 19D:
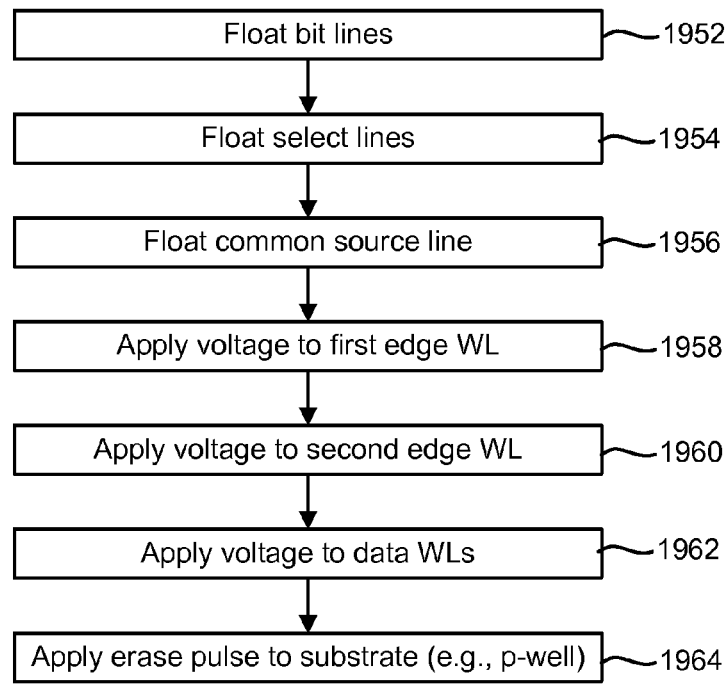
FIG. 19D is a flowchart of one embodiment of applying erase conditions.

FIG. 19D is a flowchart of one embodiment of applying erase conditions. These conditions may be applied to a NAND memory array. This process may be used during step 1504 of process 1500. In step 1952, bit lines are floated. In step 1954, the select lines (e.g., SGS, SGD) are floated. This may include floating both SGD and SGS. In step 1956, the common source line is floated.

In step 1958, a voltage is applied to a first edge WL. This voltage may increase as erase progresses (e.g., further into the sequence of erase pulses). FIGS. 13, 16, 17 and 18 show several example increases. Step 1958 could include any of these or other increases. Note that this voltage may be applied to a first edge word line at each end of a NAND string. If it is applied to the first edge word line at only one end of the NAND string, it may be applied to the first edge word line at either end.

In step 1960, a voltage is applied to a second edge word line. This voltage may be independent of the erase voltage, as depicted in FIGS. 13 and 16. This voltage may increase as the erase sequence progress, as depicted in FIG. 17. This voltage may decrease as the erase sequence progress, as depicted in FIG. 18. Also note that erase voltage dependent voltages may be applied to a third, fourth edge word lines, as already described.

In step 1962, a voltage is applied to middle WLs. A middle word line may be any word line not considered to be an edge WL. In this context, the middle word lines are those other than the edge WLs mentioned above. The voltage to the middle word lines may be a low voltage such as 0V. This voltage should be suitable to allow memory cells associated with the data WLs to erase.

In step 1964, an erase pulse is applied to the substrate (e.g., p-well). This pulse may be one of the erase voltages depicted in an example such as FIG. 13.

One embodiment includes a method for operating a non-volatile storage device, which comprises the following. A sequence of erase voltages are applied to a group of non-volatile storage elements. The erase voltages increase in magnitude as the sequence progresses. The group of non-volatile storage elements are associated with a plurality of word lines and a select line. The plurality of word lines include a first edge word line that is adjacent to the select line. The select line is floated while applying each of the erase voltages in the sequence. A voltage is applied to the first edge word line while applying each of the erase voltages in the sequence. The voltage applied to the first edge word line increases in magnitude relative to a previous voltage applied to the first edge word line for at least a portion of the sequence of erase voltages.

One embodiment includes a non-volatile storage device, comprising a group of non-volatile storage elements, a select line associated with the group of non-volatile storage elements, and a plurality of word lines associated with the group of non-volatile storage elements. The plurality of word lines include a first edge word line that is adjacent to the select line. The device further includes one or more managing circuits in communication with the plurality of word lines, the select line, and the group of non-volatile storage elements. The one or more managing circuits apply a sequence of erase voltages to the group of non-volatile storage elements that increase in magnitude as the sequence progresses. The one or more managing circuits float the select line while applying each of the erase voltages in the sequence. The one or more managing circuits apply a voltage to the first edge word line while applying each of the erase voltages in the sequence. The voltage applied to the first edge word line increases in magnitude relative to a previous voltage applied to the first edge word line for at least a portion of the sequence of erase voltages.

One embodiment includes a method for operating a non-volatile storage device. The method comprises the following. A sequence of increasing erase voltages are applied to a substrate below a group of NAND strings of non-volatile storage elements, the NAND strings associated with a plurality of data word lines, a first dummy word line, a second dummy word line, a plurality of bit lines, a first select line that is adjacent to the first dummy word line, and a second select line that is adjacent to the second dummy word line. A sequence of increasing voltages are applied to the first dummy word line and to the second dummy word line in conjunction with at least a portion of the sequence of increasing erase voltages. The first select line and the second select line are floated while applying each voltage in the sequence of increasing erase voltages to the substrate. Approximately zero volts is applied to a majority of the data word lines while applying each voltage in the sequence of increasing erase voltages to the substrate.

One embodiment includes a non-volatile storage device, comprising a substrate and a plurality of NAND strings that comprise non-volatile storage elements formed over the substrate, a first select gate at a first end of the NAND string, and a second select gate at a second end of the NAND string. The device further comprises a plurality of bit lines associated with the plurality of NAND strings, a first select line associated with the first select gates, and a second select line associated with the second select gates. The device further comprises a plurality of word lines associated with the plurality of NAND strings. The plurality of word lines include a first edge word line that is adjacent to the first select line and a second edge word line that is adjacent to the first select line. The device further comprises one or more managing circuits in communication with the plurality of word lines, the plurality of bit lines, the first and second select lines, and the substrate. The one or more managing circuits apply a sequence of erase voltages to the substrate that increase in magnitude as the sequence progresses. The one or more managing circuits float the first and second select lines while applying each of the erase voltages in the sequence. The one or more managing circuits apply a sequence of voltages to the first and second edge word lines that increase in magnitude in conjunction with the increases in magnitude for at least a portion of the sequence of erase voltages. The one or more managing circuits apply a substantially constant voltage to a majority of the plurality of word lines while applying each voltage in the sequence of increasing erase voltages to the substrate.

The above examples are provided with respect to NAND type flash memory. However, the principles of the present invention have application to other types of non-volatile memories, including those currently existing and those contemplated to use new technology being developed.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating a non-volatile storage device, the method comprising:
    applying a sequence of erase voltages to a group of non-volatile storage elements that increase in magnitude as the sequence progresses, the group of non-volatile storage elements associated with a plurality of word lines and a select line, the plurality of word lines including a first edge word line that is adjacent to the select line;
    floating the select line while applying each of the erase voltages in the sequence; and
    applying a voltage to the first edge word line while applying each of the erase voltages in the sequence, the voltage applied to the first edge word line increases in magnitude relative to a previous voltage applied to the first edge word line for at least a portion of the sequence of erase voltages.

2. The method of claim 1, wherein the voltage applied to the first edge word line increases in magnitude relative to the previous by about the same magnitude as the increase in magnitude of the corresponding erase voltage.

3. The method of claim 1, wherein the voltage applied to the first edge word line increases in magnitude relative to the previous by a smaller magnitude than the increase in magnitude of the corresponding erase voltage.

4. The method of claim 1, further comprising:
    determining for which of the erase voltages that the voltage applied to the first edge word line should be increased in magnitude based on either an erase loop count or an erase voltage magnitude.

5. The method of claim 1, wherein the plurality of word lines include a second edge word line that is adjacent to the first edge word line, and further comprising:
    applying a voltage to the second edge word line while applying each of the erase voltages in the sequence, the voltage applied to the second edge word line increases in magnitude relative to the previous for at least a portion of the sequence of erase voltages.

6. The method of claim 5, wherein the voltage applied to the second edge word line increases in magnitude relative to the previous by a smaller magnitude than the increase in magnitude of the corresponding voltage applied to the first edge word line.

7. The method of claim 1, wherein the plurality of word lines include a second edge word line that is adjacent to the first edge word line, and further comprising:
    applying a voltage to the second edge word line while applying each of the erase voltages in the sequence, the voltage applied to the second edge word line decreases in magnitude relative to the previous for at least a portion of the sequence of erase voltages.

8. The method of claim 1, wherein the first edge word line is a dummy word line, the non-volatile storage elements are arranged as NAND strings over a substrate, and further comprising:
    applying a voltage of approximately 0V to word lines of the plurality of word lines that are not receiving an increasing or decreasing voltage while applying each of the erase voltages to the group of non-volatile storage elements, the erase voltages are applied to the substrate.

9. A non-volatile storage device, comprising:
    a group of non-volatile storage elements;
    a select line associated with the group of non-volatile storage elements;
    a plurality of word lines associated with the group of non-volatile storage elements, the plurality of word lines including a first edge word line that is adjacent to the select line; and
    one or more managing circuits in communication with the plurality of word lines, the select line, and the group of non-volatile storage elements, the one or more managing circuits apply a sequence of erase voltages to the group of non-volatile storage elements that increase in magnitude as the sequence progresses, the one or more managing circuits float the select line while applying each of the erase voltages in the sequence, the one or more managing circuits apply a voltage to the first edge word line while applying each of the erase voltages in the sequence, the voltage applied to the first edge word line increases in magnitude relative to a previous voltage applied to the first edge word line for at least a portion of the sequence of erase voltages.

10. The non-volatile storage device of claim 9, wherein the one or more managing circuits apply a voltage to the first edge word line that increases by about the same magnitude as the increase in magnitude of the corresponding erase voltage.

11. The non-volatile storage device of claim 9, wherein the one or more managing circuits apply a voltage to the first edge word line that increases by a smaller magnitude than the increase in magnitude of the corresponding erase voltage.

12. The non-volatile storage device of claim 9, wherein the one or more managing circuits determine for which of the erase voltages that the voltage applied to the edge word line should be increased in magnitude based on either an erase loop count or an erase voltage magnitude.

13. The non-volatile storage device of claim 9, wherein the plurality of word lines include a plurality of edge word lines that are adjacent to the first edge word line, wherein the one or more managing circuits apply a sequence of voltages to the plurality of edge word lines that increase in magnitude relative to the previous for at least a portion of the sequence of erase voltages, the magnitude of the voltage increase is less for edge word lines that are further from the first edge word line.

14. The non-volatile storage device of claim 9, wherein the plurality of word lines include a second edge word line that is adjacent to the first edge word line, the one or more managing circuits apply a sequence of voltages to the second edge word line that decrease in magnitude relative to the previous for at least a portion of the sequence of erase voltages, the second edge word line is a data word line.

15. The non-volatile storage device of claim 9, wherein the first edge word line is a dummy word line, the non-volatile storage elements are arranged as NAND strings over a substrate, wherein the one or more managing circuits apply a voltage of approximately 0V to word lines of the plurality of word lines that are not receiving an increasing voltage while applying each of the erase voltages to the group of non-volatile storage elements, the one or more managing circuits apply the erase voltages to the substrate.

16. A method for operating a non-volatile storage device, the method comprising:
   applying a sequence of increasing erase voltages to a substrate below a group of NAND strings of non-volatile storage elements, the NAND strings associated with a plurality of data word lines, a first dummy word line, a second dummy word line, a plurality of bit lines, a first select line that is adjacent to the first dummy word line, and a second select line that is adjacent to the second dummy word line;
   applying a sequence of increasing voltages to the first dummy word line and to the second dummy word line in conjunction with at least a portion of the sequence of increasing erase voltages;
   floating the first select line and the second select line while applying each voltage in the sequence of increasing erase voltages to the substrate; and
   applying approximately zero volts to a majority of the data word lines while applying each voltage in the sequence of increasing erase voltages to the substrate.

17. The method of claim 16, wherein the plurality of word lines include a first data word line that is adjacent to the first dummy word line, and further comprising:
   applying a sequence of voltages to the first data word line that decrease in magnitude in conjunction with the increases in magnitude for at least a portion of the sequence of erase voltages.

18. The method of claim 17, wherein the applying a sequence of increasing voltages to the first dummy word line and to the second dummy word line in conjunction with at least a portion of the sequence of increasing erase voltages includes:
   beginning to increase the magnitude of the voltage applied to the first and second dummy word lines only after either a first pre-determined number of erase voltages are applied to the substrate or only after the erase voltage has reached a first pre-determined magnitude; and
   wherein the applying a sequence of voltages to the first data word line that decrease in magnitude in conjunction with the increases in magnitude for at least a portion of the sequence of erase voltages includes:
   beginning to increase the magnitude of the voltage applied to the first data word line only after either a second pre-determined number of erase voltages are applied to the substrate or only after the erase voltage has reached a second pre-determined magnitude.

19. The method of claim 16, wherein the applying a sequence of increasing voltages to the first dummy word line and to the second dummy word line in conjunction with at least a portion of the sequence of increasing erase voltages includes:
   beginning to increase the magnitude of the voltage applied to the first and second dummy word lines only after either a pre-determined number of erase voltages are applied to the substrate or only after the erase voltage has reached a pre-determined magnitude.

20. The method of claim 16, wherein the applying a sequence of increasing voltages to the first dummy word line and to the second dummy word line in conjunction with at least a portion of the sequence of increasing erase voltages includes:
   maintaining the magnitude of the voltage applied to the first and second dummy word lines after a pre-determined number of erase voltages are applied to the substrate or after the erase voltage has reached a pre-determined magnitude.

21. A non-volatile storage device, comprising:
   a substrate;
   a plurality of NAND strings comprising non-volatile storage elements formed over the substrate, a first select gate at a first end of the NAND string, and a second select gate at a second end of the NAND string;
   a plurality of bit lines associated with the plurality of NAND strings;
   a first select line associated with the first select gates;
   a second select line associated with the second select gates;
   a plurality of word lines associated with the plurality of NAND strings, the plurality of word lines including a first edge word line that is adjacent to the first select line and a second edge word line that is adjacent to the first select line; and
   one or more managing circuits in communication with the plurality of word lines, the plurality of bit lines, the first and second select lines, and the substrate, the one or more managing circuits apply a sequence of erase voltages to the substrate that increase in magnitude as the sequence progresses, the one or more managing circuits float the first and second select lines while applying each of the erase voltages in the sequence, the one or more managing circuits apply a sequence of voltages to the first and second edge word lines that increase in magnitude in conjunction with the increases in magnitude for at least a portion of the sequence of erase voltages, the one or more managing circuits apply a substantially constant voltage to a majority of the plurality of word lines while applying each voltage in the sequence of increasing erase voltages to the substrate.

22. The non-volatile storage device of claim 21, wherein the plurality of word lines include a first data word line that is adjacent to the first edge word line, wherein the one or more managing circuits apply a sequence of voltages to the first data word line that decrease in magnitude in conjunction with the increases in magnitude for at least a portion of the sequence of erase voltages.

* * * * *